US012646575B2

(12) United States Patent
Wang et al.

(10) Patent No.: US 12,646,575 B2
(45) Date of Patent: *Jun. 2, 2026

(54) STRING BASED ERASE INHIBIT FOR ONE SIDED GATE-INDUCED DRAIN LEAKAGE ERASE

(71) Applicant: Western Digital Technologies, Inc., San Jose, CA (US)

(72) Inventors: Ming Wang, Shanghai (CN); Liang Li, Shanghai (CN); Jiahui Yuan, Fremont, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 147 days.

This patent is subject to a terminal disclaimer.

(21) Appl. No.: 18/442,684

(22) Filed: Feb. 15, 2024

(65) Prior Publication Data

US 2025/0266109 A1     Aug. 21, 2025

(51) Int. Cl.
| | |
|---|---|
| *G11C 16/34* | (2006.01) |
| *G11C 16/04* | (2006.01) |
| *G11C 16/14* | (2006.01) |
| *G11C 16/16* | (2006.01) |
| *G11C 16/24* | (2006.01) |

(52) U.S. Cl.
CPC ...... *G11C 16/3445* (2013.01); *G11C 16/0483* (2013.01); *G11C 16/14* (2013.01); *G11C 16/16* (2013.01); *G11C 16/24* (2013.01)

(58) Field of Classification Search
CPC . G11C 16/3445; G11C 16/0483; G11C 16/14; G11C 16/16; G11C 16/24
See application file for complete search history.

(56) References Cited

U.S. PATENT DOCUMENTS

| | | | | |
|---|---|---|---|---|
| 7,668,018 | B2 * | 2/2010 | Syzdek | G11C 16/349 |
| | | | | 365/185.29 |
| 8,649,219 | B2 | 2/2014 | Li | |
| 8,958,249 | B2 | 2/2015 | Dutta | |
| 9,099,202 | B2 | 8/2015 | Mihnea | |
| 9,224,494 | B2 * | 12/2015 | Chin | G11C 16/16 |
| 9,390,808 | B1 * | 7/2016 | Kato | G11C 8/14 |
| 10,923,197 | B2 * | 2/2021 | Lu | H10B 43/35 |
| 11,309,041 | B2 * | 4/2022 | Li | G11C 29/50004 |
| 11,355,198 | B1 * | 6/2022 | Wu | G11C 16/08 |
| 11,636,905 | B2 | 4/2023 | Puthenthermadam | |

(Continued)

*Primary Examiner* — Amir Zarabian
*Assistant Examiner* — Justin Bryce Heisterkamp
(74) *Attorney, Agent, or Firm* — Dickinson Wright PLLC

(57) ABSTRACT
A memory apparatus includes memory cells configured to store a threshold voltage and disposed in memory holes each defining a channel. The memory apparatus also includes a control means configured to apply a first erase voltage to the channel of each of the memory holes including the memory cells in a first loop of an erase operation. The control means verifies the threshold voltage of the memory cells being erased using a target erase verify level voltage and at least one high erase verify level voltage higher than the target erase verify level voltage. The control means slows erasing of ones of the memory cells in a second loop of the erase operation in response to the threshold voltage of the ones of the memory cells being erased being greater than the target erase verify level voltage and less than the at least one high erase verify level voltage.

20 Claims, 24 Drawing Sheets

(56)                     References Cited

U.S. PATENT DOCUMENTS

| | | | |
|---|---|---|---|
| 2020/0411105 A1* | 12/2020 | Lee | G11C 16/14 |
| 2021/0272638 A1* | 9/2021 | Hou | G11C 16/08 |
| 2022/0223210 A1* | 7/2022 | Huang | G11C 16/10 |
| 2023/0049605 A1 | 2/2023 | Tomiie | |
| 2024/0281148 A1* | 8/2024 | Lai | G06F 3/0659 |
| 2024/0385755 A1* | 11/2024 | Wan | G06F 3/0659 |
| 2024/0419339 A1* | 12/2024 | Huang | G06F 3/0679 |
| 2025/0037772 A1* | 1/2025 | Wang | G11C 16/0483 |
| 2025/0174286 A1* | 5/2025 | Wang | G11C 16/0483 |

* cited by examiner

600

BLK3

BLK2

BLK1

605

BLK0

603

602

601

604 z

BL(y)

WL(x)

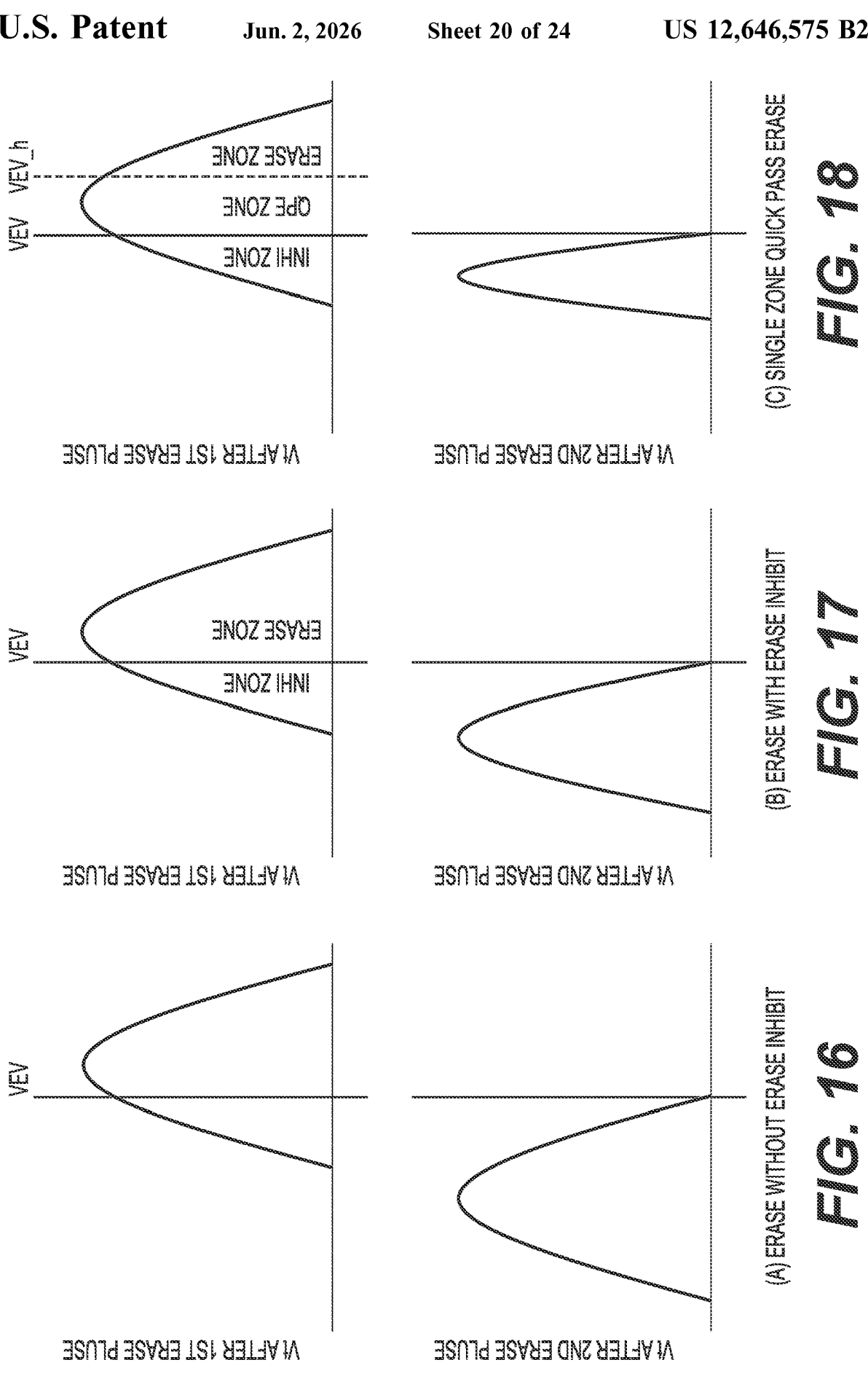

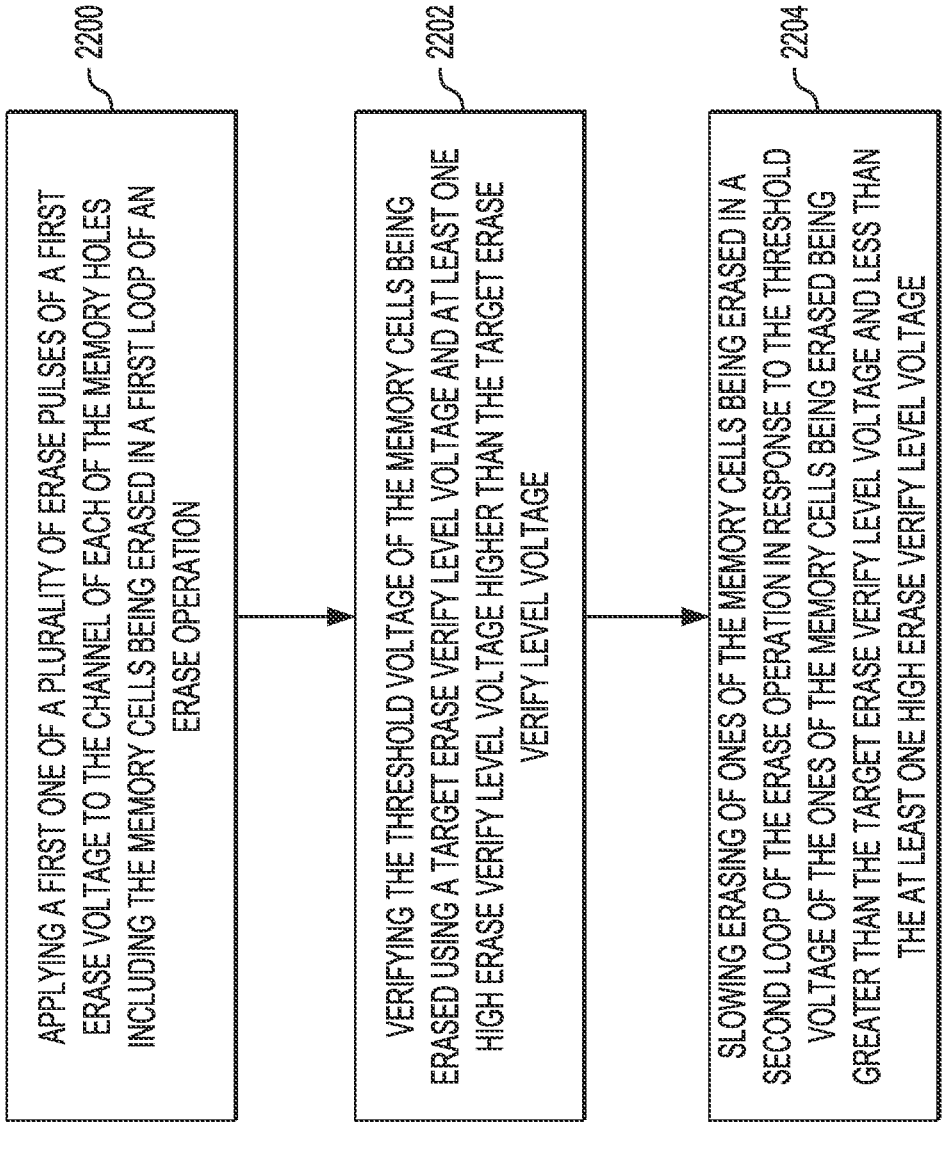

2200

APPLYING A FIRST ONE OF A PLURALITY OF ERASE PULSES OF A FIRST ERASE VOLTAGE TO THE CHANNEL OF EACH OF THE MEMORY HOLES INCLUDING THE MEMORY CELLS BEING ERASED IN A FIRST LOOP OF AN ERASE OPERATION

2202

VERIFYING THE THRESHOLD VOLTAGE OF THE MEMORY CELLS BEING ERASED USING A TARGET ERASE VERIFY LEVEL VOLTAGE AND AT LEAST ONE HIGH ERASE VERIFY LEVEL VOLTAGE HIGHER THAN THE TARGET ERASE VERIFY LEVEL VOLTAGE

2204

SLOWING ERASING OF ONES OF THE MEMORY CELLS BEING ERASED IN A SECOND LOOP OF THE ERASE OPERATION IN RESPONSE TO THE THRESHOLD VOLTAGE OF THE ONES OF THE MEMORY CELLS BEING ERASED BEING GREATER THAN THE TARGET ERASE VERIFY LEVEL VOLTAGE AND LESS THAN THE AT LEAST ONE HIGH ERASE VERIFY LEVEL VOLTAGE

FIG. 22

STRING BASED ERASE INHIBIT FOR ONE SIDED GATE-INDUCED DRAIN LEAKAGE ERASE

FIELD

This application relates to non-volatile memory apparatuses and the operation of non-volatile memory apparatuses.

BACKGROUND

This section provides background information related to the technology associated with the present disclosure and, as such, is not necessarily prior art.

Semiconductor memory apparatuses have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory apparatuses to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

SUMMARY

This section provides a general summary of the present disclosure and is not a comprehensive disclosure of its full scope or all of its features and advantages.

An object of the present disclosure is to provide a memory apparatus and a method of operating the memory apparatus that address and overcome the above-noted shortcomings.

Accordingly, it is an aspect of the present disclosure to provide a memory apparatus including memory cells configured to store a threshold voltage corresponding to one of a plurality of data states and disposed in memory holes each defining a channel. The memory apparatus also includes a control means configured to apply a first one of a plurality of erase pulses of a first erase voltage to the channel of each of the memory holes including the memory cells being erased in a first loop of an erase operation. The control means verifies the threshold voltage of the memory cells being erased using a target erase verify level voltage and at least one high erase verify level voltage higher than the target erase verify level voltage. The control means is also configured to slow erasing of ones of the memory cells being erased in a second loop of the erase operation in response to the threshold voltage of the ones of the memory cells being erased being greater than the target erase verify level voltage and less than the at least one high erase verify level voltage.

According to another aspect of the disclosure, a controller in communication with a memory apparatus including memory cells configured to store a threshold voltage corresponding to one of a plurality of data states is provided. The memory cells are disposed in memory holes each defining a channel. The controller is configured to instruct the memory apparatus to apply a first one of a plurality of erase pulses of a first erase voltage to the channel of each of the memory holes including the memory cells being erased in a first loop of an erase operation. The controller is further configured to instruct the memory apparatus to verify the threshold voltage of the memory cells being erased using a target erase verify level voltage and at least one high erase verify level voltage higher than the target erase verify level voltage. The controller is also configured to instruct the memory apparatus to slow erasing of ones of the memory cells being erased in a second loop of the erase operation in response to the threshold voltage of the ones of the memory cells being erased being greater than the target erase verify level voltage and less than the at least one high erase verify level voltage.

According to an additional aspect of the disclosure a method of operating a memory apparatus is provided. The memory apparatus includes memory cells configured to store a threshold voltage corresponding to one of a plurality of data states is provided. The memory cells are disposed in memory holes each defining a channel. The method includes the step of applying a first one of a plurality of erase pulses of a first erase voltage to the channel of each of the memory holes including the memory cells being erased in a first loop of an erase operation. The method proceeds by verifying the threshold voltage of the memory cells being erased using a target erase verify level voltage and at least one high erase verify level voltage higher than the target erase verify level voltage. The method also includes the step of slowing erasing of ones of the memory cells being erased in a second loop of the erase operation in response to the threshold voltage of the ones of the memory cells being erased being greater than the target erase verify level voltage and less than the at least one high erase verify level voltage.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 16 shows a threshold voltage distribution of memory cells in a first loop and a second loop of a conventional erase without inhibit according to aspects of the disclosure;

FIG. 17 shows a threshold voltage distribution of memory cells in the first loop and the second loop of a conventional erase with inhibit according to aspects of the disclosure;

FIG. 18 shows a threshold voltage distribution of memory cells in the first loop and the second loop of the single zone quick pass erase according to aspects of the disclosure;

FIG. 22 illustrates steps of a method of operating a memory apparatus according to aspects of the disclosure.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figures 1A, 1B:
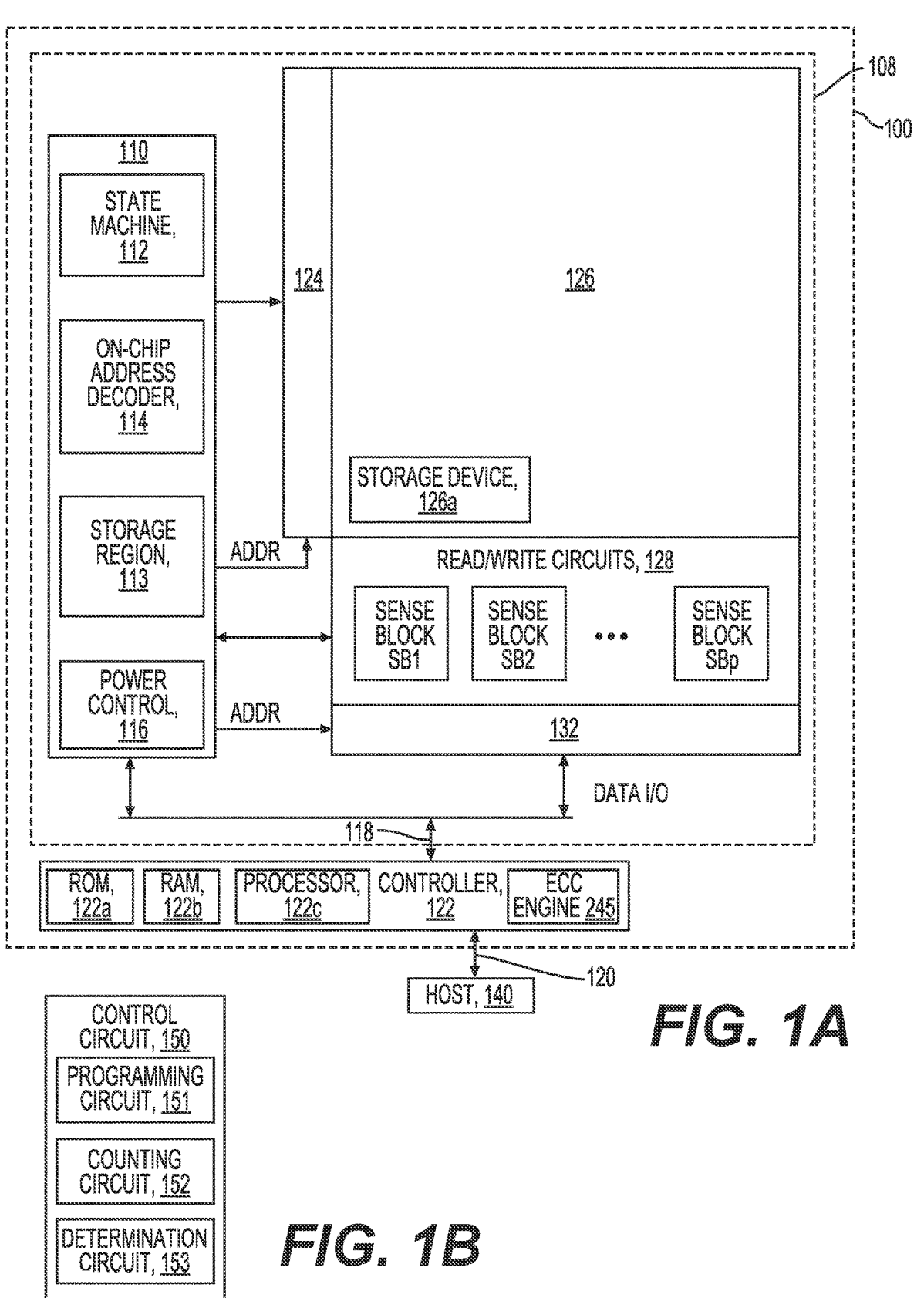
FIG. 1A is a block diagram of an example memory device according to aspects of the disclosure.
FIG. 1B is a block diagram of an example control circuit which comprises a programming circuit, a counting circuit, and a determination circuit according to aspects of the disclosure.

In the following description, details are set forth to provide an understanding of the present disclosure. In some instances, certain circuits, structures and techniques have not been described or shown in detail in order not to obscure the disclosure.

In general, the present disclosure relates to non-volatile memory apparatuses of the type well-suited for use in many applications. The non-volatile memory apparatus and associated methods of operation of this disclosure will be described in conjunction with one or more example embodiments. However, the specific example embodiments disclosed are merely provided to describe the inventive concepts, features, advantages and objectives with sufficient clarity to permit those skilled in this art to understand and practice the disclosure. Specifically, the example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

As described, non-volatile memory systems are a type of memory that retains stored information without requiring an external power source. Non-volatile memory is widely used in various electronic devices and in stand-alone memory devices. For example, non-volatile memory can be found in laptops, digital audio player, digital cameras, smart phones, video games, scientific instruments, industrial robots, medical electronics, solid-state drives, USB drives, memory cards, and the like. Non-volatile memory can be electronically programmed/reprogrammed and erased.

Examples of non-volatile memory systems include flash memory, such as NAND flash or NOR flash. NAND flash memory structures typically arrange multiple memory cell transistors (e.g., floating-gate transistors or charge trap transistors) in series with and between two select gates (e.g., a drain-side select gate and a source-side select gate). The memory cell transistors in series and the select gates may be referred to as a NAND string. NAND flash memory may be scaled in order to reduce cost per bit.

A programming operation for a set of memory cells of a memory device typically involves applying a series of program voltages to the memory cells after the memory cells are provided in an erased state. Each program voltage is provided in a program loop, also referred to as a program-verify iteration. For example, the program voltage may be applied to a word line which is connected to control gates of the memory cells. In one approach, incremental step pulse programming is performed, where the program voltage is increased by a step size in each program loop. Verify operations may be performed after each program voltage to determine whether the memory cells have completed programming. When programming is completed for a memory cell, it can be locked out from further programming while programming continues for other memory cells in subsequent program loops.

Each memory cell may be associated with a data state according to write data in a program command. Based on its data state, a memory cell will either remain in the erased state or be programmed to a data state (a programmed data state) different from the erased state. For example, in a one-bit per cell memory device (single-level cell (SLC)), there are two data states including the erased state and one higher data state. In a two-bit per cell memory device (multi-level cell (MLC)), there are four data states including the erased state and three higher data states referred to as the A, B and C data states (see FIG. 9). In a three-bit per cell memory device (triple-level cell (TLC)), there are eight data states including the erased state and seven higher data states referred to as the A, B, C, D, E, F and G data states (see FIG. 10). In a four-bit per cell memory device (quad-level cell (QLC)), there are sixteen data states including the erased state and fifteen higher data states referred to as the Er, 1, 2, 3, 4, 5, 6, 7, 8, 9, A, B, C, D, E and F data states (see FIG. 11). Each memory cell may store a data state (e.g., a binary value) and is programmed to a threshold voltage state corresponding to the data state. Each state represents a different value and is assigned a voltage window including a range of possible threshold voltages.

When a program command is issued, the write data is stored in latches associated with the memory cells. During programming, the latches of a memory cell can be read to determine the data state to which the cell is to be programmed. Each programmed data state is associated with a verify voltage such that a memory cell with a given data state is considered to have completed programming when a sensing operation determines its threshold voltage (Vth) is above the associated verify voltage. A sensing operation can determine whether a memory cell has a Vth above the associated verify voltage by applying the associated verify voltage to the control gate and sensing a current through the memory cell. If the current is relatively high, this indicates the memory cell is in a conductive state, such that the Vth is less than the control gate voltage. If the current is relatively low, this indicates the memory cell is in a non-conductive state, such that the Vth is above the control gate voltage.

Before programming, the memory cells are typically erased in an erase operation. A 3D stacked non-volatile memory device can be arranged in multiple blocks, where the erase operation may be performed one block at a time. The erase operation can include multiple erase-verify iterations which are performed until an erase-verify condition is met for the block, at which point the erase operation ends. One approach is for the erase-verify condition to allow a predetermined number of fail bits. That is, the erase operation can be declared to be successful even if a small number of memory cells have not reached the erase state. However, this approach does not prevent fast-erasing memory cells from becoming "over-erased". As a result, over-erase of some of the memory cells can occur, causing serious degradation of the memory cells as excessive holes are accumulated in the tunneling path. To help avoid over erase, embodiments described herein are directed to a string-based erase inhibit.

To help further illustrate the foregoing, FIG. 1A will now be described. FIG. 1A is a block diagram of an example memory device. The memory device 100 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. Typically a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. A storage region 113 may be provided, e.g., for verify parameters as described herein.

The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, SGS and SGD transistors and source lines. The sense blocks can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SBb, SB2, . . . , SBp, read/write circuits 128, controller 122, and so forth.

The control circuits can include a programming circuit configured to program memory cells of a word line of a block and verify the set of the memory cells. The control circuits can also include a counting circuit configured to determine a number of memory cells that are verified to be in a data state. The control circuits can also include a determination circuit configured to determine, based on the number, whether the block is faulty.

For example, FIG. 1B is a block diagram of an example control circuit 150 which comprises a programming circuit 151, a counting circuit 152 and a determination circuit 153. The programming circuit may include software, firmware and/or hardware. The counting circuit may include software, firmware and/or hardware. The determination circuit may include software, firmware and/or hardware.

The off-chip controller 122 may comprise a processor 122 *c*, storage devices (memory) such as ROM 122 *a* and RAM 122 *b* and an error-correction code (ECC) engine 245. The ECC engine can correct a number of read errors which are caused when the upper tail of a Vth distribution becomes too high. However, uncorrectable errors may exist in some cases. The techniques provided herein reduce the likelihood of uncorrectable errors.

The storage device comprises code such as a set of instructions, and the processor is operable to execute the set of instructions to provide the functionality described herein. Alternatively or additionally, the processor can access code from a storage device 126 *a* of the memory structure, such as a reserved area of memory cells in one or more word lines.

For example, code can be used by the controller 122 to access the memory structure such as for programming, read and erase operations. The code can include boot code and control code (e.g., set of instructions). The boot code is software that initializes the controller during a booting or startup process and enables the controller to access the memory structure. The code can be used by the controller to control one or more memory structures. Upon being powered up, the processor 122 *c* fetches the boot code from the ROM 122 *a* or storage device 126 *a* for execution, and the boot code initializes the system components and loads the control code into the RAM 122 *b*. Once the control code is loaded into the RAM, it is executed by the processor. The control code includes drivers to perform basic tasks such as controlling and allocating memory, prioritizing the processing of instructions, and controlling input and output ports.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the two dimensional and three dimensional exemplary structures described but covers all relevant memory structures within the spirit and scope of the technology as described herein and as understood by one of skill in the art.

Figure 2:
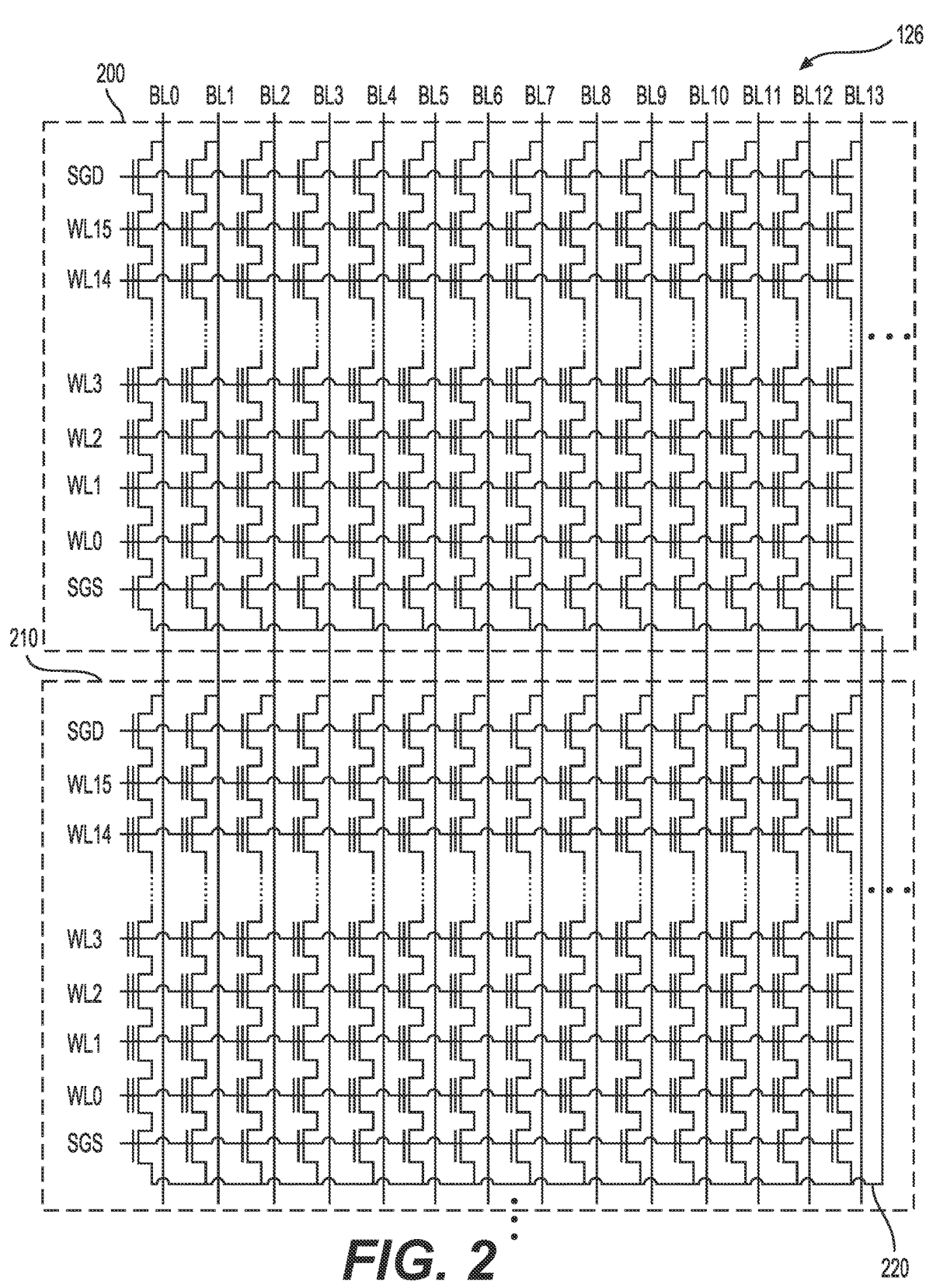
FIG. 2 depicts blocks of memory cells in an example two-dimensional configuration of the memory array of FIG. 1 according to aspects of the disclosure.

FIG. 2 depicts blocks of memory cells in an example two-dimensional configuration of the memory array 126 of FIG. 1A. The memory array can include many blocks. Each example block 200, 210 includes a number of NAND strings and respective bit lines, e.g., BL0, BL1, . . . which are shared among the blocks. Each NAND string is connected at one end to a drain select gate (SGD), and the control gates of the drain select gates are connected via a common SGD line. The NAND strings are connected at their other end to a source select gate which, in turn, is connected to a common source line 220. Sixteen word lines, for example, WL0-WL15, extend between the source select gates and the drain select gates. In some cases, dummy word lines, which contain no user data, can also be used in the memory array adjacent to the select gate transistors. Such dummy word lines can shield the edge data word line from certain edge effects.

One type of non-volatile memory which may be provided in the memory array is a floating gate memory. See FIGS. 3A and 3B. Other types of non-volatile memory can also be used. For example, a charge-trapping memory cell uses a non-conductive dielectric material in place of a conductive floating gate to store charge in a non-volatile manner. See FIGS. 4A and 4B. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

Figure 3A:
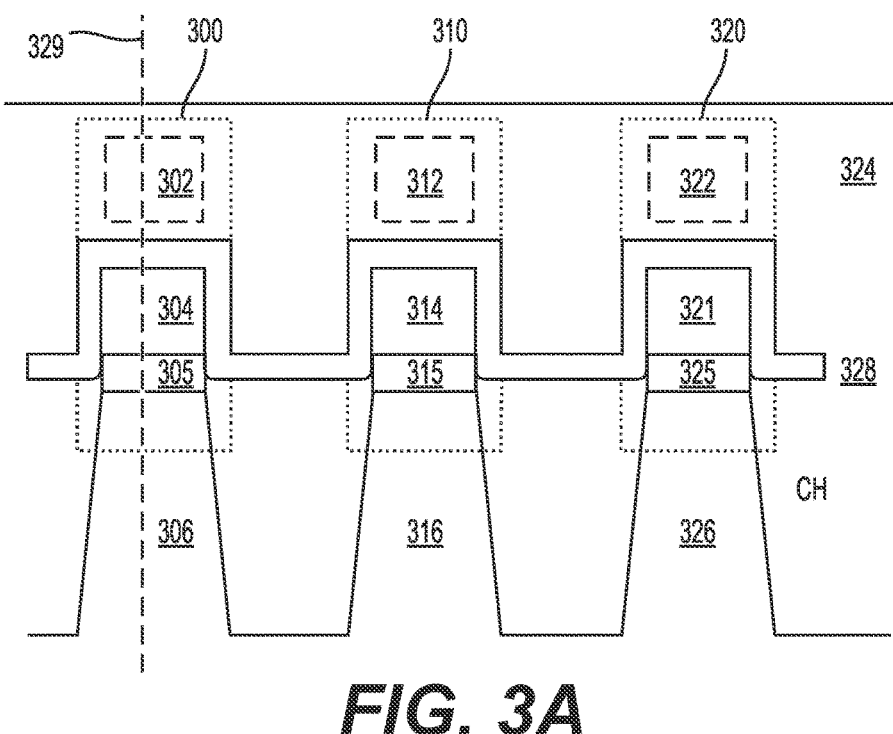
FIG. 3A depicts a cross-sectional view of example floating gate memory cells in NAND strings according to aspects of the disclosure.

FIG. 3A depicts a cross-sectional view of example floating gate memory cells in NAND strings. A bit line or NAND string direction goes into the page, and a word line direction goes from left to right. As an example, word line 324 extends across NAND strings which include respective channel regions 306, 316 and 326. The memory cell 300 includes a control gate 302, a floating gate 304, a tunnel oxide layer 305 and the channel region 306 . . . . The memory cell 310 includes a control gate 312, a floating gate 314, a tunnel oxide layer 315 and the channel region 316. The memory cell 320 includes a control gate 322, a floating gate 321, a tunnel oxide layer 325 and the channel region 326. Each memory cell is in a different respective NAND string. An inter-poly dielectric (IPD) layer 328 is also depicted. The control gates are portions of the word line. A cross-sectional view along line 329 is provided in FIG. 3B.

Figure 4A:
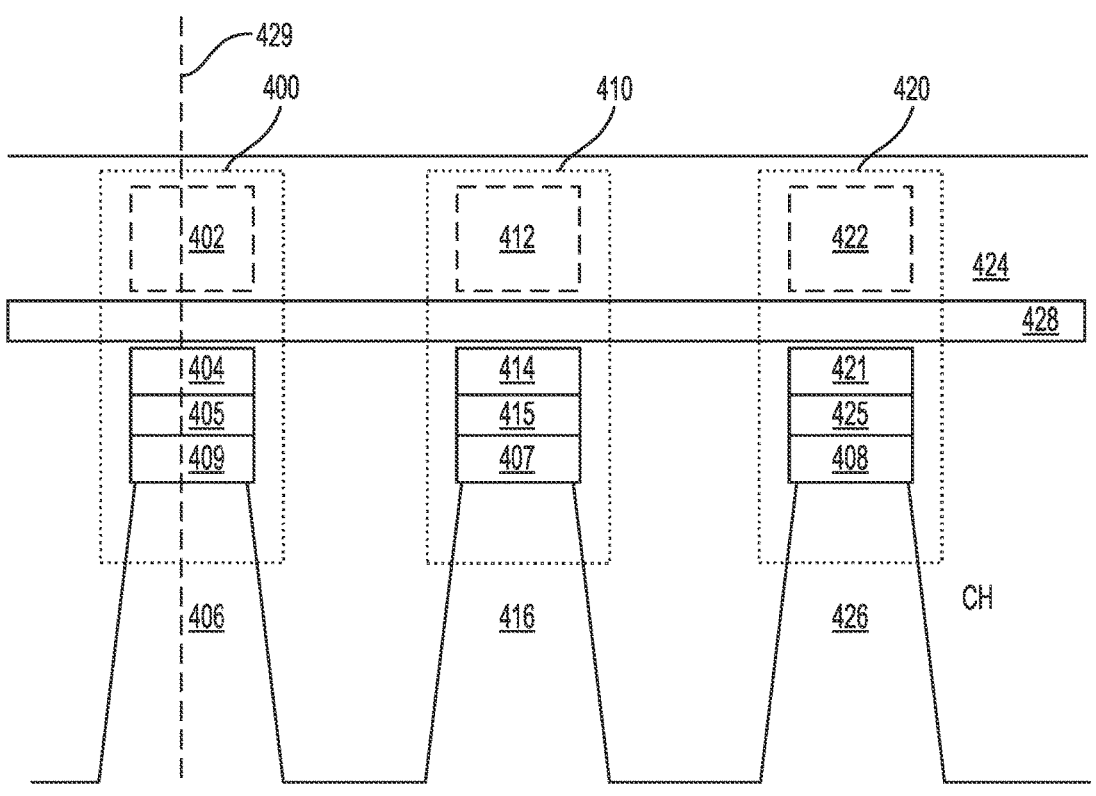
FIG. 4A depicts a cross-sectional view of example charge-trapping memory cells in NAND strings according to aspects of the disclosure.
Figure 4B:
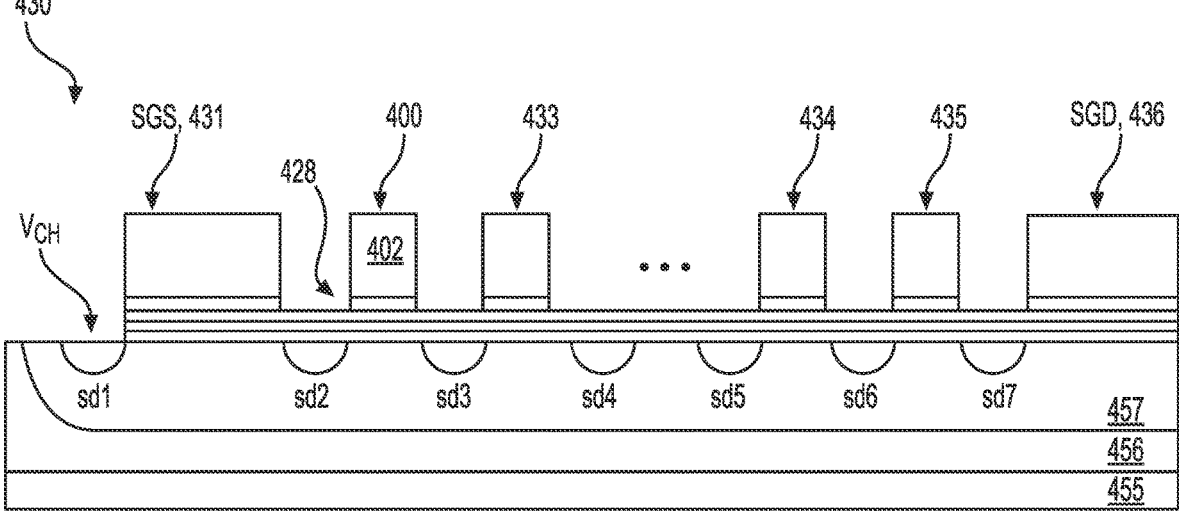
FIG. 4B depicts a cross-sectional view of the structure of FIG. 4A along line 429 according to aspects of the disclosure.

The control gate wraps around the floating gate, increasing the surface contact area between the control gate and floating gate. This results in higher IPD capacitance, leading to a higher coupling ratio which makes programming and erase easier. However, as NAND memory devices are scaled down, the spacing between neighboring cells becomes smaller so there is almost no space for the control gate and the IPD between two adjacent floating gates. As an alternative, as shown in FIGS. 4A and 4B, the flat or planar memory cell has been developed in which the control gate is flat or planar; that is, it does not wrap around the floating gate, and its only contact with the charge storage layer is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

Figure 3B:
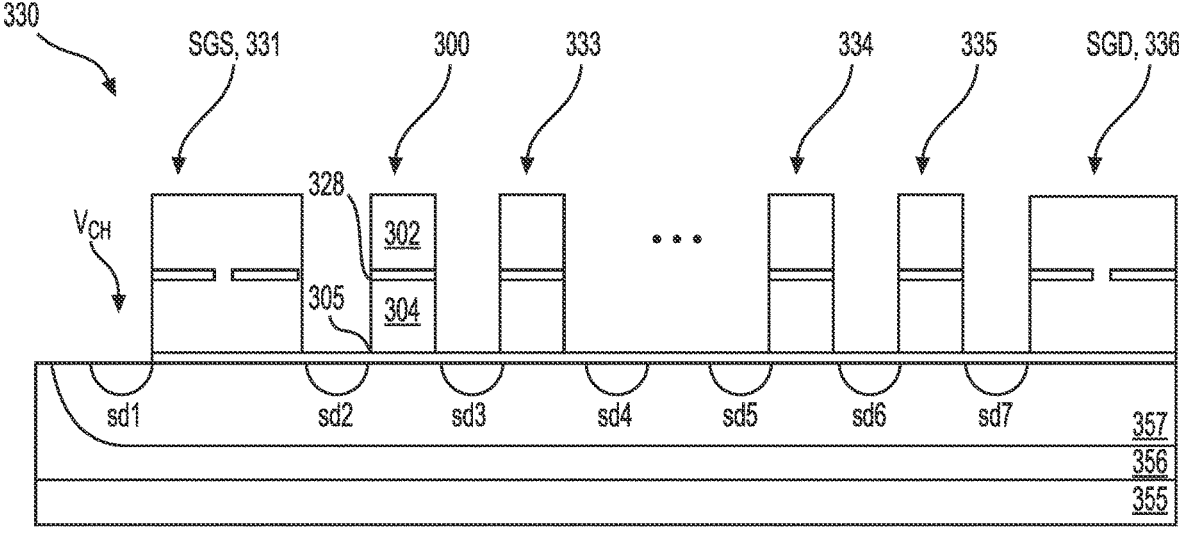
FIG. 3B depicts a cross-sectional view of the structure of FIG. 3A along line 329 according to aspects of the disclosure.

FIG. 3B depicts a cross-sectional view of the structure of FIG. 3A along line 329. The NAND string 330 includes an SGS transistor 331, example memory cells 300, 333, . . . , 334 and 335, and an SGD transistor 336. The memory cell 300, as an example of each memory cell, includes the control gate 302, the IPD layer 328, the floating gate 304 and the tunnel oxide layer 305, consistent with FIG. 3A. Passageways in the IPD layer in the SGS and SGD transistors allow the control gate layers and floating gate layers to communicate. The control gate and floating gate layers may be polysilicon and the tunnel oxide layer may be silicon oxide, for instance. The IPD layer can be a stack of nitrides (N) and oxides (O) such as in a N—O—N—O—N configuration.

The NAND string may be formed on a substrate which comprises a p-type substrate region 355, an n-type well 356 and a p-type well 357. N-type source/drain diffusion regions sd1, sd2, sd3, sd4, sd5, sd6 and sd7 are formed in the p-type well. A channel voltage, Vch, may be applied directly to the channel region of the substrate.

FIG. 4A depicts a cross-sectional view of example charge-trapping memory cells in NAND strings. The view is in a word line direction of memory cells comprising a flat control gate and charge-trapping regions as a 2D example of memory cells in the memory cell array 126 of FIG. 1A. Charge-trapping memory can be used in NOR and NAND flash memory device. This technology uses an insulator such as a SiN film to store electrons, in contrast to a floating-gate MOSFET technology which uses a conductor such as doped polycrystalline silicon to store electrons. As an example, a word line (WL) 424 extends across NAND strings which include respective channel regions 406, 416 and 426. Portions of the word line provide control gates 402, 412 and 422. Below the word line is an IPD layer 428, charge-trapping layers 404, 414 and 421, polysilicon layers 405, 415 and 425 and tunneling layer layers 409, 407 and 408. Each charge-trapping layer extends continuously in a respective NAND string.

A memory cell 400 includes the control gate 402, the charge-trapping layer 404, the polysilicon layer 405 and a portion of the channel region 406. A memory cell 410 includes the control gate 412, the charge-trapping layer 414, a polysilicon layer 415 and a portion of the channel region 416. A memory cell 420 includes the control gate 422, the charge-trapping layer 421, the polysilicon layer 425 and a portion of the channel region 426.

A flat control gate is used here instead of a control gate that wraps around a floating gate. One advantage is that the charge-trapping layer can be made thinner than a floating gate. Additionally, the memory cells can be placed closer together.

FIG. 4B depicts a cross-sectional view of the structure of FIG. 4A along line 429. The view shows a NAND string 430 having a flat control gate and a charge-trapping layer. The NAND string 430 includes an SGS transistor 431, example memory cells 400, 433, . . . , 434 and 435, and an SGD transistor 436.

The NAND string may be formed on a substrate which comprises a p-type substrate region 455, an n-type well 456 and a p-type well 457. N-type source/drain diffusion regions sd1, sd2, sd3, sd4, sd5, sd6 and sd7 are formed in the p-type well 457. A channel voltage, Vch, may be applied directly to the channel region of the substrate. The memory cell 400 includes the control gate 402 and the IPD layer 428 above the charge-trapping layer 404, the polysilicon layer 405, the tunneling layer 409 and the channel region 406.

The control gate layer may be polysilicon and the tunneling layer may be silicon oxide, for instance. The IPD layer can be a stack of high-k dielectrics such as AlOx or HfOx which help increase the coupling ratio between the control gate layer and the charge-trapping or charge storing layer. The charge-trapping layer can be a mix of silicon nitride and oxide, for instance.

The SGD and SGS transistors have the same configuration as the memory cells but with a longer channel length to ensure that current is cutoff in an inhibited NAND string.

In this example, the layers 404, 405 and 409 extend continuously in the NAND string. In another approach, portions of the layers 404, 405 and 409 which are between the control gates 402, 412 and 422 can be removed, exposing a top surface of the channel 406.

Figure 5A:
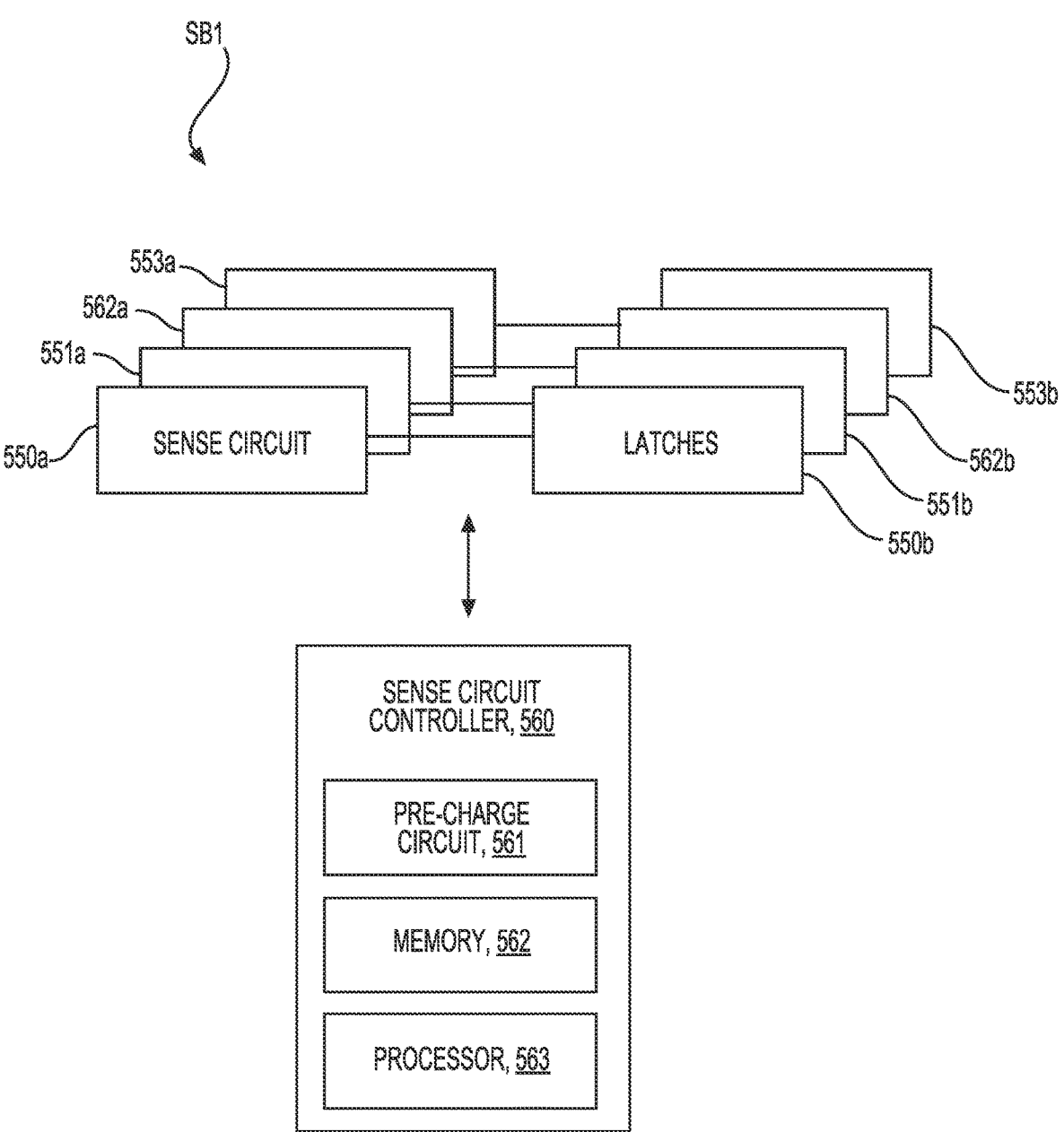
FIG. 5A depicts an example block diagram of the sense block SB1 of FIG. 1 according to aspects of the disclosure.

FIG. 5A depicts an example block diagram of the sense block SB1 of FIG. 1A. In one approach, a sense block comprises multiple sense circuits. Each sense circuit is associated with data latches. For example, the example sense circuits 550 a, 551 a, 552 a and 553 a are associated with the data latches 550 b, 551 b, 552 b and 553 b, respectively. In one approach, different subsets of bit lines can be sensed using different respective sense blocks. This allows the processing load which is associated with the sense circuits to be divided up and handled by a respective processor in each sense block. For example, a sense circuit controller 560 in SB1 can communicate with the set of sense circuits and latches. The sense circuit controller may include a pre-charge circuit 561 which provides a voltage to each sense circuit for setting a pre-charge voltage. In one possible approach, the voltage is provided to each sense circuit independently, e.g., via the data bus, DBUS 503 and a local bus such as LBUS1 or LBUS2 in FIG. 5B. In another possible approach, a common voltage is provided to each sense circuit concurrently, e.g., via the line 505 in FIG. 5B. The sense circuit controller may also include a memory 562 and a processor 563. As mentioned also in connection with FIG. 2, the memory 562 may store code which is executable by the processor to perform the functions described herein. These functions can include reading latches which are associated with the sense circuits, setting bit values in the latches and providing voltages for setting pre-charge levels in sense nodes of the sense circuits. Further example details of the sense circuit controller and the sense circuits 550 a and 551 a are provided below.

Figure 5B:
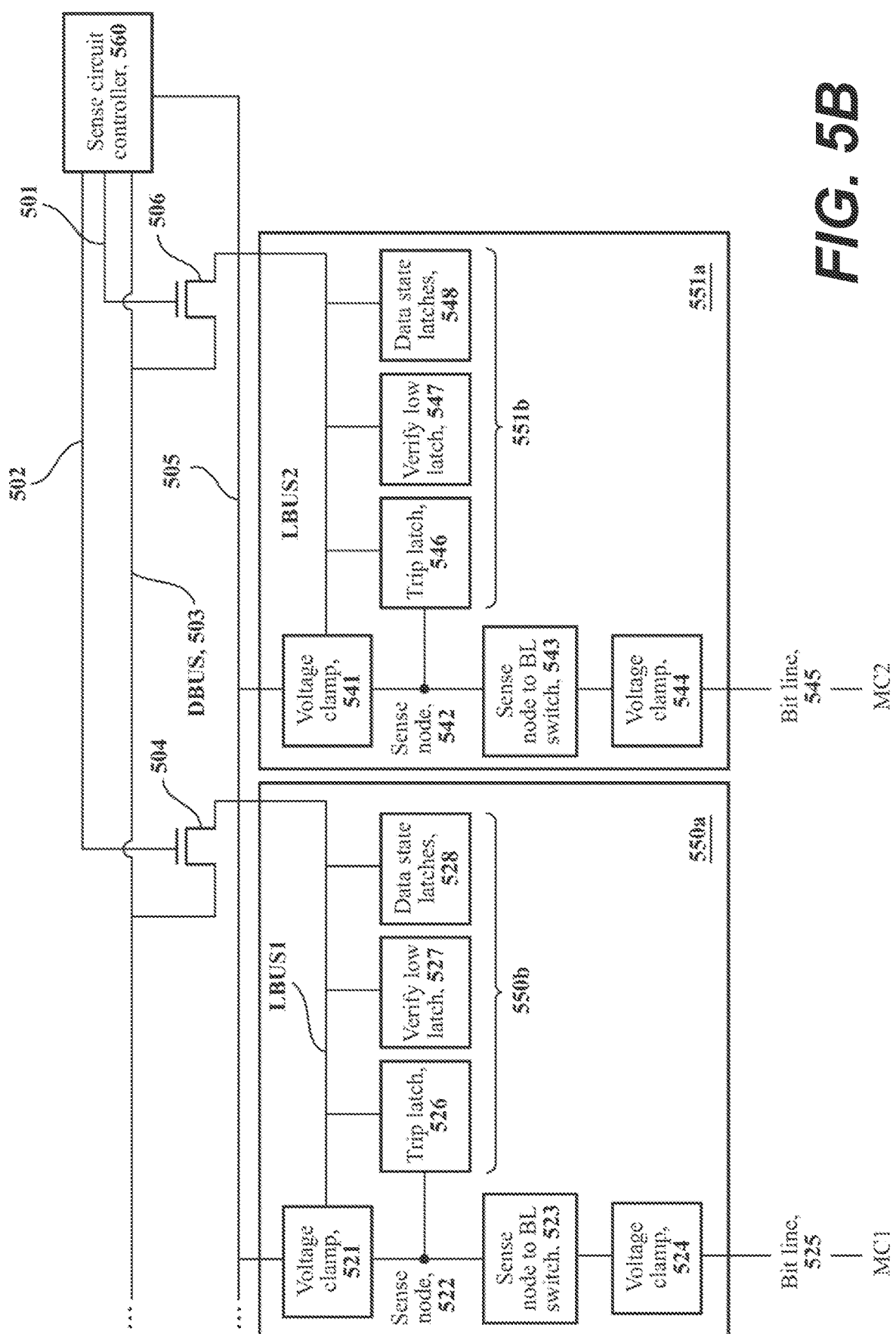
FIG. 5B depicts another example block diagram of the sense block SB1 of FIG. 1 according to aspects of the disclosure.

FIG. 5B depicts another example block diagram of the sense block SB1 of FIG. 1A. The sense circuit controller 560 communicates with multiple sense circuits including example sense circuits 550 a and 551 a, also shown in FIG. 5A. The sense circuit 550 a includes latches 550 b, including a trip latch 526, an offset verify latch 527 and data state latches 528. The sense circuit further includes a voltage clamp 521 such as a transistor which sets a pre-charge voltage at a sense node 522. A sense node to bit line (BL) switch 523 selectively allows the sense node to communicate with a bit line 525, e.g., the sense node is electrically connected to the bit line so that the sense node voltage can decay. The bit line 525 is connected to one or more memory cells such as a memory cell MC1. A voltage clamp 524 can set a voltage on the bit line, such as during a sensing operation or during a program voltage. A local bus, LBUS1, allows the sense circuit controller to communicate with components in the sense circuit, such as the latches 550 b and the voltage clamp in some cases. To communicate with the sense circuit 550 a, the sense circuit controller provides a voltage via a line 502 to a transistor 504 to connect LBUS1 with a data bus DBUS, 503. The communicating can include sending data to the sense circuit and/or receive data from the sense circuit.

The sense circuit controller can communicate with different sense circuits in a time-multiplexed manner, for instance. A line 505 may be connected to the voltage clamp in each sense circuit, in one approach.

The sense circuit 551 *a* includes latches 551*b*, including a trip latch 546, an offset verify latch 547 and data state latches 548. A voltage clamp 541 may be used to set a pre-charge voltage at a sense node 542. A sense node to bit line (BL) switch 543 selectively allows the sense node to communicate with a bit line 545, and a voltage clamp 544 can set a voltage on the bit line. The bit line 545 is connected to one or more memory cells such as a memory cell MC2. A local bus, LBUS2, allows the sense circuit controller to communicate with components in the sense circuit, such as the latches 551*b* and the voltage clamp in some cases. To communicate with the sense circuit 551 *a*, the sense circuit controller provides a voltage via a line 501 to a transistor 506 to connect LBUS2 with DBUS.

The sense circuit 550 *a* may be a first sense circuit which comprises a first trip latch 526 and the sense circuit 551 *a* may be a second sense circuit which comprises a second trip latch 546.

The sense circuit 550 *a* is an example of a first sense circuit comprising a first sense node 522, where the first sense circuit is associated with a first memory cell MC1 and a first bit line 525. The sense circuit 551 *a* is an example of a second sense circuit comprising a second sense node 542, where the second sense circuit is associated with a second memory cell MC2 and a second bit line 545.

Figure 6A:
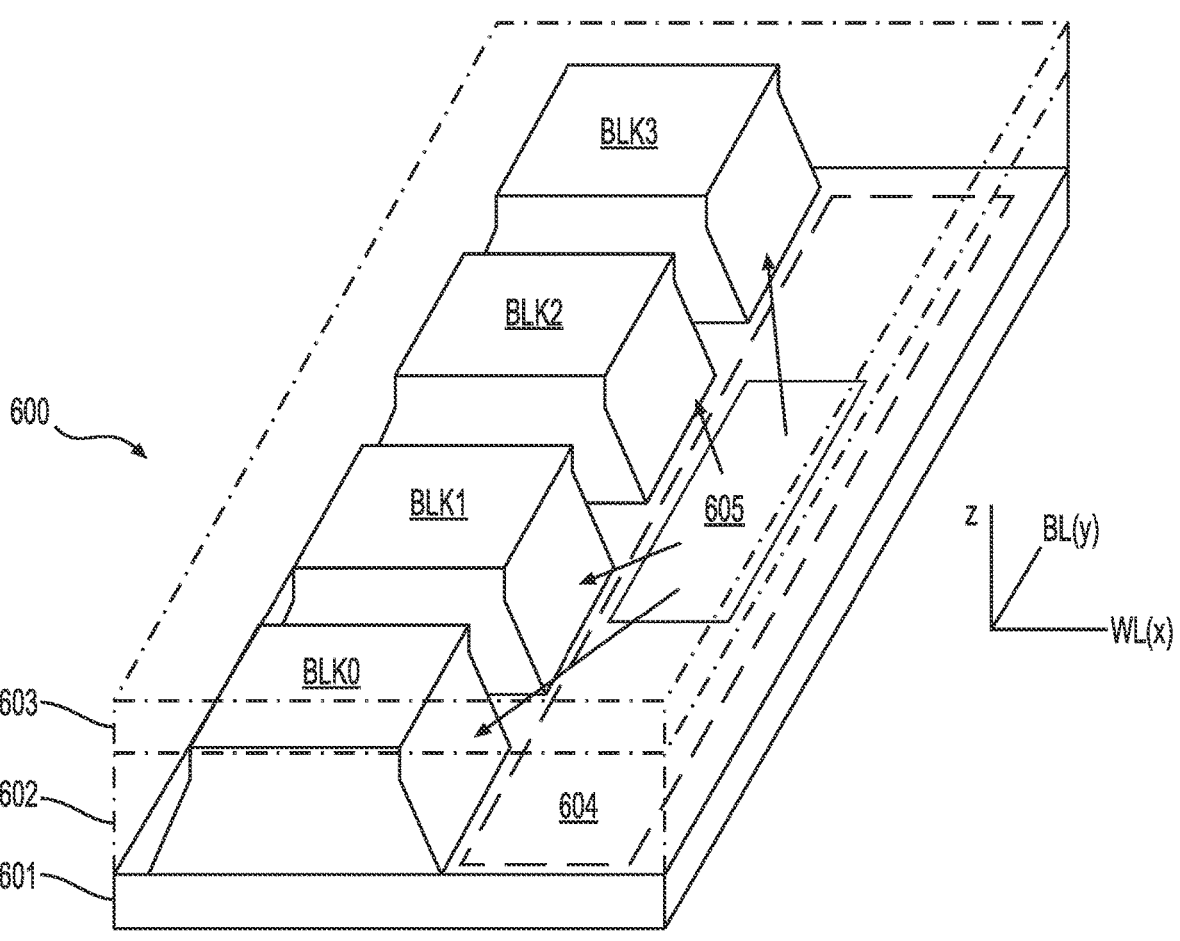
FIG. 6A is a perspective view of a set of blocks in an example three-dimensional configuration of the memory array of FIG. 1 according to aspects of the disclosure.

FIG. 6A is a perspective view of a set of blocks 600 in an example three-dimensional configuration of the memory array 126 of FIG. 1A. On the substrate are example blocks BLK0, BLK1, BLK2 and BLK3 of memory cells (storage elements) and a peripheral area 604 with circuitry for use by the blocks. For example, the circuitry can include voltage drivers 605 which can be connected to control gate layers of the blocks. In one approach, control gate layers at a common height in the blocks are commonly driven. The substrate 601 can also carry circuitry under the blocks, along with one or more lower metal layers which are patterned in conductive paths to carry signals of the circuitry. The blocks are formed in an intermediate region 602 of the memory device. In an upper region 603 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 6B:
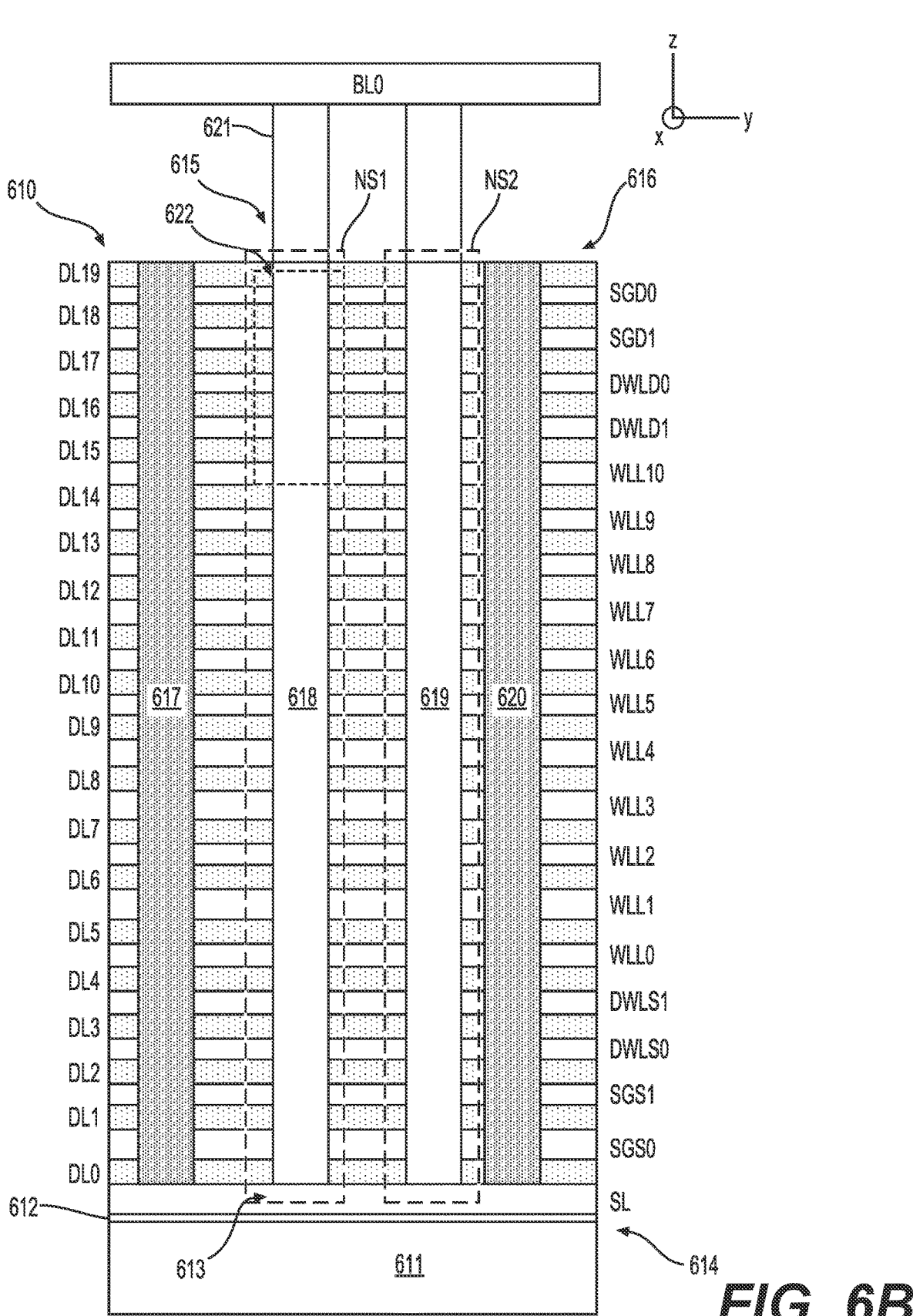
FIG. 6B depicts an example cross-sectional view of a portion of one of the blocks of FIG. 6A according to aspects of the disclosure.

FIG. 6B depicts an example cross-sectional view of a portion of one of the blocks of FIG. 6A. The block comprises a stack 610 of alternating conductive and dielectric layers. In this example, the conductive layers comprise two SGD layers, two SGS layers and four dummy word line layers DWLD0, DWLD1, DWLS0 and DWLS1, in addition to data word line layers (word lines) WLL0-WLL10. The dielectric layers are labelled as DL0-DL19. Further, regions of the stack which comprise NAND strings NS1 and NS2 are depicted. Each NAND string encompasses a memory hole 618 or 619 which is filled with materials which form memory cells adjacent to the word lines. A region 622 of the stack is shown in greater detail in FIG. 6D.

The stack includes a substrate 611, an insulating film 612 on the substrate, and a portion of a source line SL. NS1 has a source-end 613 at a bottom 614 of the stack and a drain-end 615 at a top 616 of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

Figure 6C:
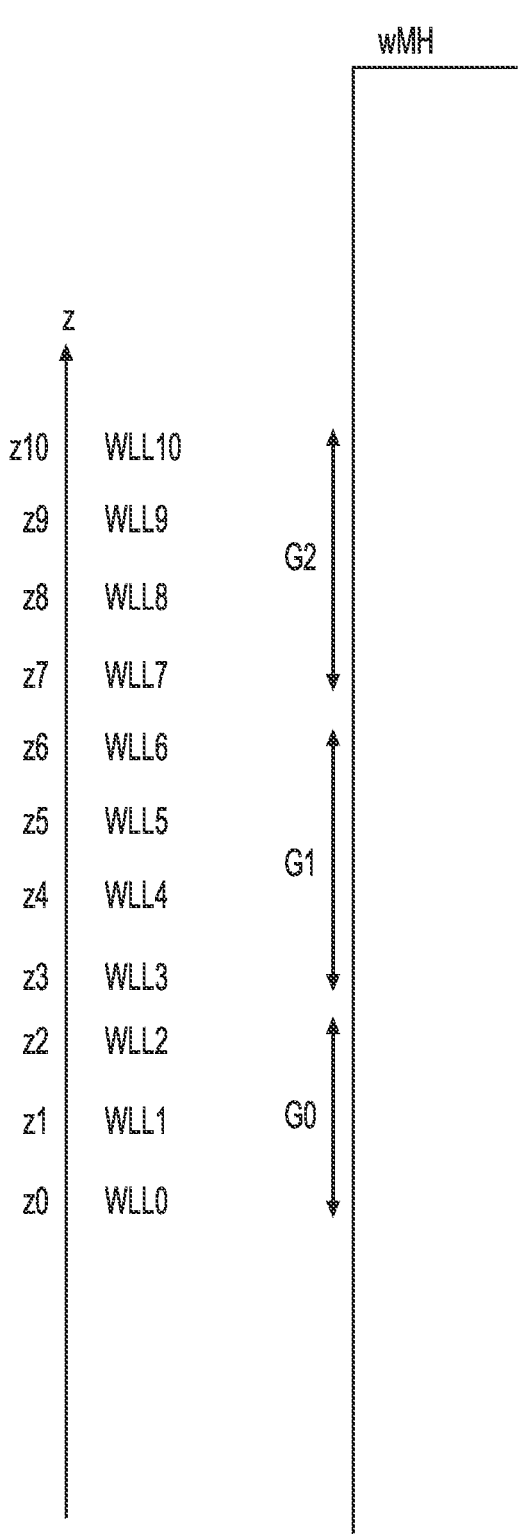
FIG. 6C depicts a plot of memory hole diameter in the stack of FIG. 6B according to aspects of the disclosure.

FIG. 6C depicts a plot of memory hole diameter in the stack of FIG. 6B. The vertical axis is aligned with the stack of FIG. 6B and depicts a width (wMH), e.g., diameter, of the memory holes 618 and 619. The word line layers WLL0-WLL10 of FIG. 6A are repeated as an example and are at respective heights z0-z10 in the stack. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole. That is, the memory holes are tapered, narrowing at the bottom of the stack. In some cases, a slight narrowing occurs at the top of the hole near the select gate so that the diameter becomes slight wider before becoming progressively smaller from the top to the bottom of the memory hole.

Due to the non-uniformity in the width of the memory hole, the programming speed, including the program slope and erase speed of the memory cells can vary based on their position along the memory hole, e.g., based on their height in the stack. With a smaller diameter memory hole, the electric field across the tunnel oxide is relatively stronger, so that the programming and erase speed is relatively higher. One approach is to define groups of adjacent word lines for which the memory hole diameter is similar, e.g., within a defined range of diameter, and to apply an optimized verify scheme for each word line in a group. Different groups can have different optimized verify schemes.

Figure 6D:
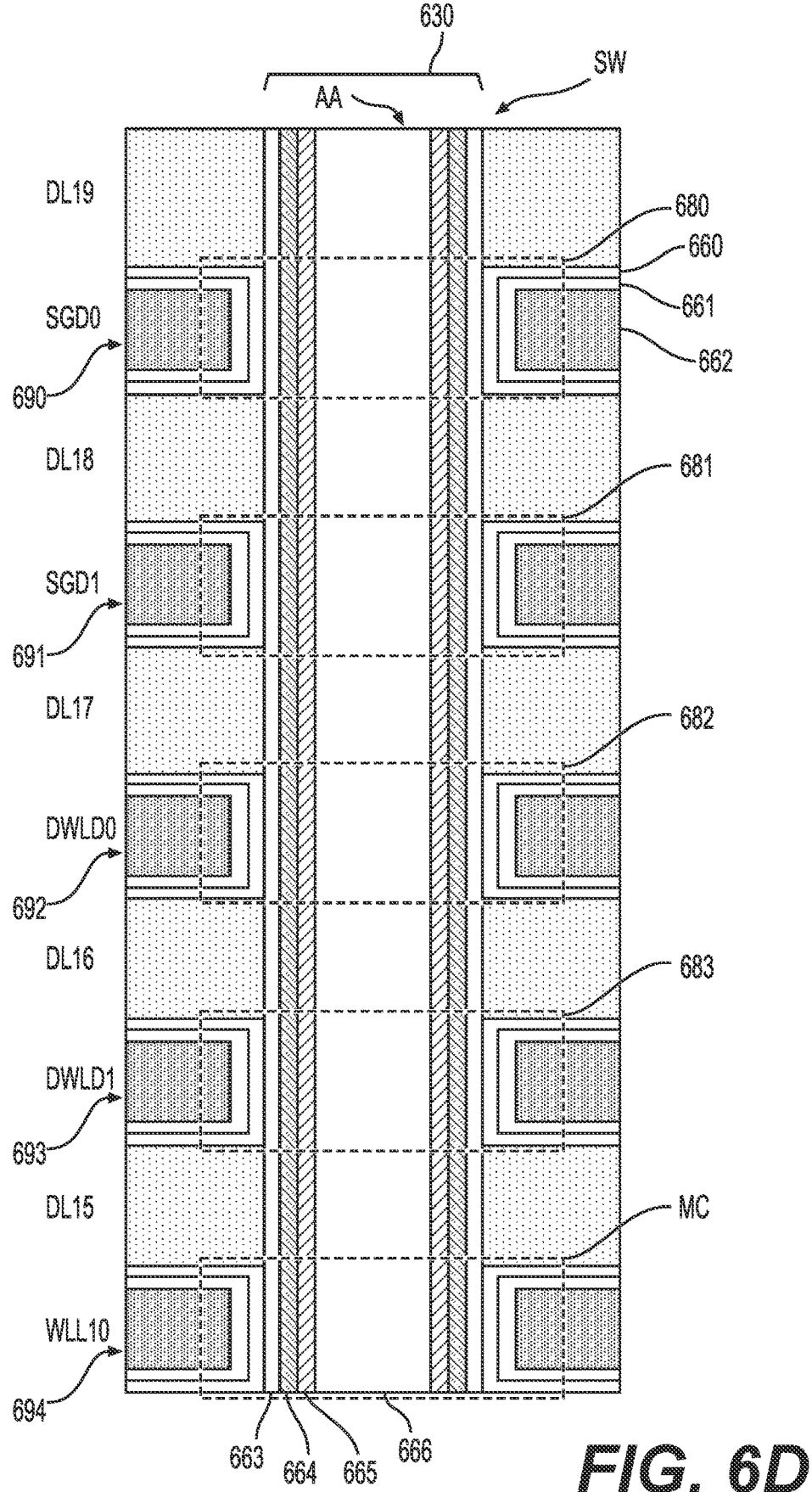
FIG. 6D depicts a close-up view of the region 622 of the stack of FIG. 6B according to aspects of the disclosure.

FIG. 6D depicts a close-up view of the region 622 of the stack of FIG. 6B. Memory cells are formed at the different levels of the stack at the intersection of a word line layer and a memory hole. In this example, SGD transistors 680 and 681 are provided above dummy memory cells 682 and 683 and a data memory cell MC. A number of layers can be deposited along the sidewall (SW) of the memory hole 630 and/or within each word line layer, e.g., using atomic layer deposition. For example, each column (e.g., the pillar which is formed by the materials within a memory hole) can include a charge-trapping layer or film 663 such as SiN or other nitride, a tunneling layer 664, a polysilicon body or channel 665, and a dielectric core 666. A word line layer can include a blocking oxide/block high-k material 660, a metal barrier 661, and a conductive metal 662 such as Tungsten as a control gate. For example, control gates 690, 691, 692, 693 and 694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

Figures 7A, 7B:
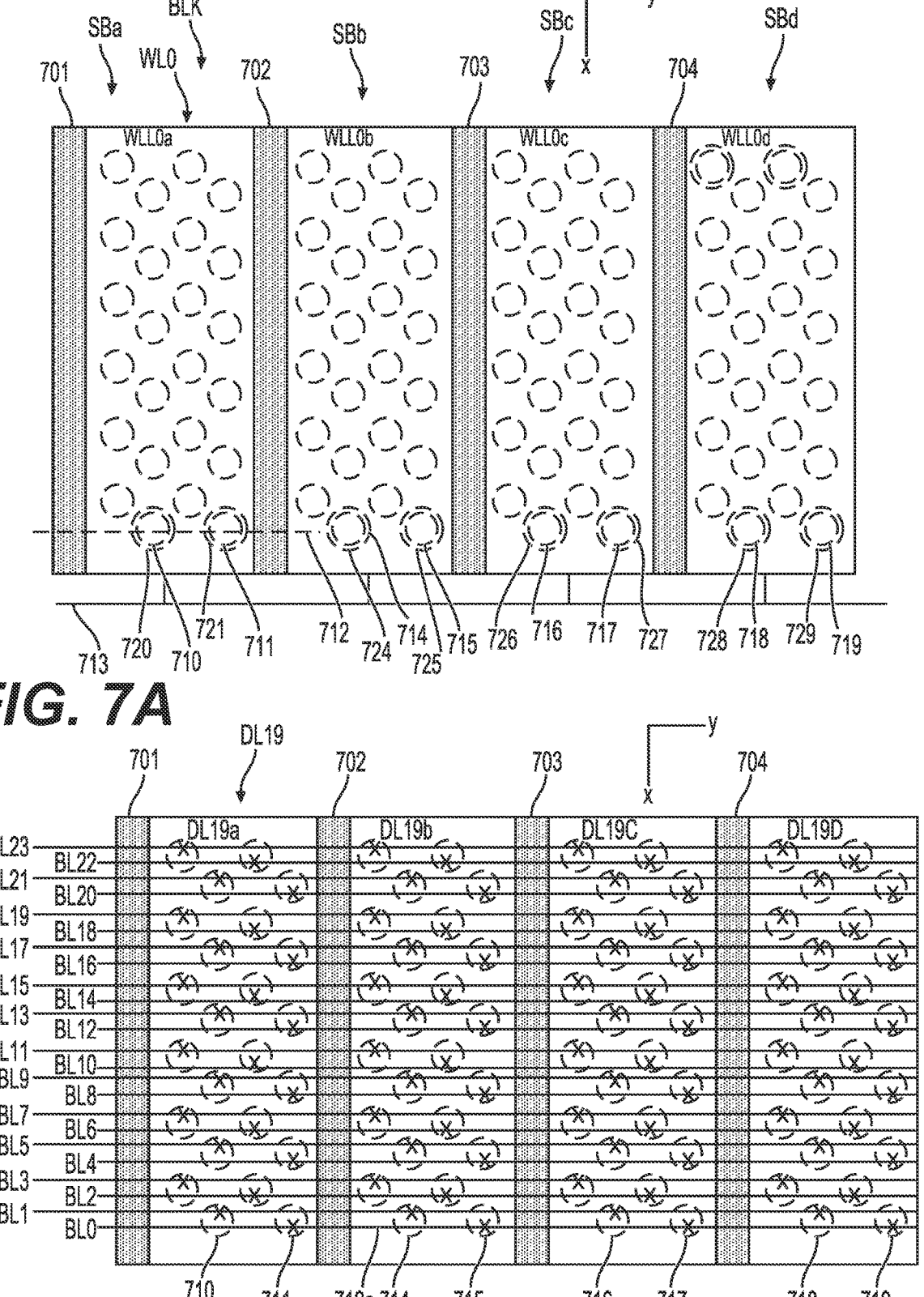
FIG. 7A depicts a top view of an example word line layer WLL0 of the stack of FIG. 6B according to aspects of the disclosure.
FIG. 7B depicts a top view of an example top dielectric layer DL19 of the stack of FIG. 6B according to aspects of the disclosure.

FIG. 7A depicts a top view of an example word line layer WLL0 of the stack of FIG. 6B. As mentioned, a 3D memory device can comprise a stack of alternating conductive and dielectric layers. The conductive layers provide the control gates of the SG transistors and memory cells. The layers used for the SG transistors are SG layers and the layers used for the memory cells are word line layers. Further, memory holes are formed in the stack and filled with a charge-trapping material and a channel material. As a result, a vertical NAND string is formed. Source lines are connected to the NAND strings below the stack and bit lines are connected to the NAND strings above the stack.

A block BLK in a 3D memory device can be divided into sub-blocks, where each sub-block comprises a set of NAND string which have a common SGD control line. For example, see the SGD lines/control gates SGD0, SGD1, SGD2 and SGD3 in the sub-blocks SBa, SBb, SBc and SBd, respectively. The sub-blocks SBa, SBb, SBc and SBd may also be referred herein as a string of memory cells of a word line. As described, a string of memory cells of a word line may include a plurality of memory cells that are part of the same sub-block, and that are also disposed in the same word line layer and/or that are configured to have their control gates biased by the same word line and/or with the same word line voltage.

Further, a word line layer in a block can be divided into regions. Each region is in a respective sub-block are can extend between slits which are formed periodically in the stack to process the word line layers during the fabrication process of the memory device. This processing can include replacing a sacrificial material of the word line layers with metal. Generally, the distance between slits should be relatively small to account for a limit in the distance that an etchant can travel laterally to remove the sacrificial material, and that the metal can travel to fill a void which is created by the removal of the sacrificial material. For example, the distance between slits may allow for a few rows of memory holes between adjacent slits. The layout of the memory holes and slits should also account for a limit in the number of bit lines which can extend across the region while each bit line is connected to a different memory cell. After processing the word line layers, the slits can optionally be filed with metal to provide an interconnect through the stack.

This figure and other are not necessarily to scale. In practice, the regions can be much longer in the x-direction relative to the y-direction than is depicted to accommodate additional memory holes.

In this example, there are four rows of memory holes between adjacent slits. A row here is a group of memory holes which are aligned in the x-direction. Moreover, the rows of memory holes are in a staggered pattern to increase the density of the memory holes. The word line layer or word line is divided into regions WLL0 a, WLL0b, WLL0 c and WLL0 d which are each connected by a connector 713. The last region of a word line layer in a block can be connected to a first region of a word line layer in a next block, in one approach. The connector, in turn, is connected to a voltage driver for the word line layer. The region WLL0 a has example memory holes 710 and 711 along a line 712. The region WLL0b has example memory holes 714 and 715. The region WLL0c has example memory holes 716 and 717. The region WLL0d has example memory holes 718 and 719. The memory holes are also shown in FIG. 7B. Each memory hole can be part of a respective NAND string. For example, the memory holes 710, 714, 716 and 718 can be part of NAND strings NS0_SBa, NS0_SBb, NS0_SBc and NS0_SBd, respectively.

Each circle represents the cross-section of a memory hole at a word line layer or SG layer. Example circles shown with dashed lines represent memory cells which are provided by the materials in the memory hole and by the adjacent word line layer. For example, memory cells 720 and 721 are in WLL0 a, memory cells 724 and 725 are in WLL0b, memory cells 726 and 727 are in WLL0c, and memory cells 728 and 729 are in WLL0d. These memory cells are at a common height in the stack.

Metal-filled slits 701, 702, 703 and 704 (e.g., metal interconnects) may be located between and adjacent to the edges of the regions WLL0 a-WLL0d. The metal-filled slits provide a conductive path from the bottom of the stack to the top of the stack. For example, a source line at the bottom of the stack may be connected to a conductive line above the stack, where the conductive line is connected to a voltage driver in a peripheral region of the memory device. See also FIG. 8A for further details of the sub-blocks SBa-SBd of FIG. 7A.

FIG. 7B depicts a top view of an example top dielectric layer DL19 of the stack of FIG. 6B. The dielectric layer is divided into regions DL19 a, DL19b, DL19 cand DL19d. Each region can be connected to a respective voltage driver. This allows a set of memory cells in one region of a word line layer to be programmed concurrently, with each memory cell being in a respective NAND string which is connected to a respective bit line. A voltage can be set on each bit line to allow or inhibit programming during each program voltage.

The region DL19 a has the example memory holes 710 and 711 along a line 712 a which is coincident with a bit line BL0. A number of bit lines extend above the memory holes and are connected to the memory holes as indicated by the "X" symbols. BL0 is connected to a set of memory holes which includes the memory holes 711, 715, 717 and 719. Another example bit line BL1 is connected to a set of memory holes which includes the memory holes 710, 714, 716 and 718. The metal-filled slits 701, 702, 703 and 704 from FIG. 7A are also depicted, as they extend vertically through the stack. The bit lines can be numbered in a sequence BL0-BL23 across the DL019 layer in the −x direction.

Different subsets of bit lines are connected to cells in different rows. For example, BL0, BL4, BL8, BL12, BL16 and BL20 are connected to cells in a first row of cells at the right hand edge of each region. BL2, BL6, BL10, BL14, BL18 and BL22 are connected to cells in an adjacent row of cells, adjacent to the first row at the right hand edge. BL3, BL7, BL11, BL15, BL19 and BL23 are connected to cells in a first row of cells at the left hand edge of each region. BL1, BLS, BL9, BL13, BL17 and BL21 are connected to cells in an adjacent row of cells, adjacent to the first row at the left hand edge.

Figure 8A:
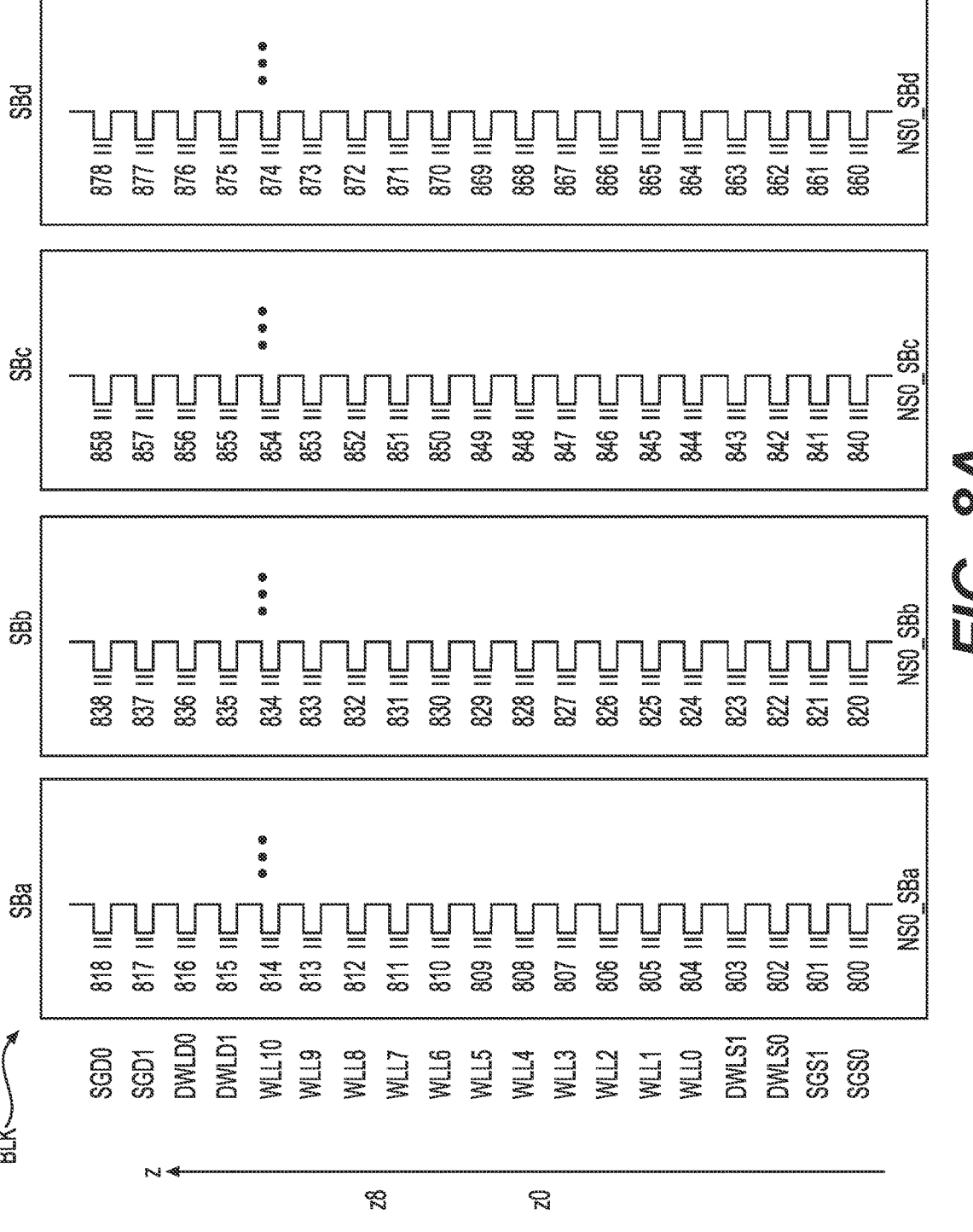
FIG. 8A depicts example NAND strings in the sub-blocks SBa-SBd of FIG. 7A according to aspects of the disclosure.

FIG. 8A depicts example NAND strings in the sub-blocks SBa-SBd of FIG. 7A. The sub-blocks are consistent with the structure of FIG. 6B. The conductive layers in the stack are depicted for reference at the left hand side. Each sub-block includes multiple NAND strings, where one example NAND string is depicted. For example, SBa comprises an example NAND string NS0_SBa, SBb comprises an example NAND string NS0_SBb, SBc comprises an example NAND string NS0_SBc, and SBd comprises an example NAND string NS0_SBd.

Additionally, NS0_SBa include SGS transistors 800 and 801, dummy cells 802 and 803, data memory cells 804, 805, 806, 807, 808, 809, 810, 811, 812, 813 and 814, dummy memory cells 815 and 816, and SGD transistors 817 and 818.

NS0_SBb include SGS transistors 820 and 821, dummy memory cells 822 and 823, data memory cells 824, 825, 826, 827, 828, 829, 830, 831, 832, 833 and 834, dummy memory cells 835 and 836, and SGD transistors 837 and 838.

NS0_SBc include SGS transistors 840 and 841, dummy memory cells 842 and 843, data memory cells 844, 845, 846, 847, 848, 849, 850, 851, 852, 853 and 854, dummy memory cells 855 and 856, and SGD transistors 857 and 858.

NS0_SBd include SGS transistors 860 and 861, dummy memory cells 862 and 863, data memory cells 864, 865, 866, 867, 868, 869, 870, 871, 872, 873 and 874, dummy memory cells 875 and 876, and SGD transistors 877 and 878.

At a given height in the block, a set of memory cells in each sub-block are at a common height. For example, one set of memory cells (including the memory cell 804) is among a plurality of memory cells formed along tapered memory holes in a stack of alternating conductive and dielectric layers. The one set of memory cells is at a particular height z0 in the stack. Another set of memory cells (including the memory cell 824) connected to the one word line (WLL0) are also at the particular height. In another approach, the set of memory cells (e.g., including the memory cell 812) connected to another word line (e.g., WLL8) are at another height (z8) in the stack.

Figure 8B:
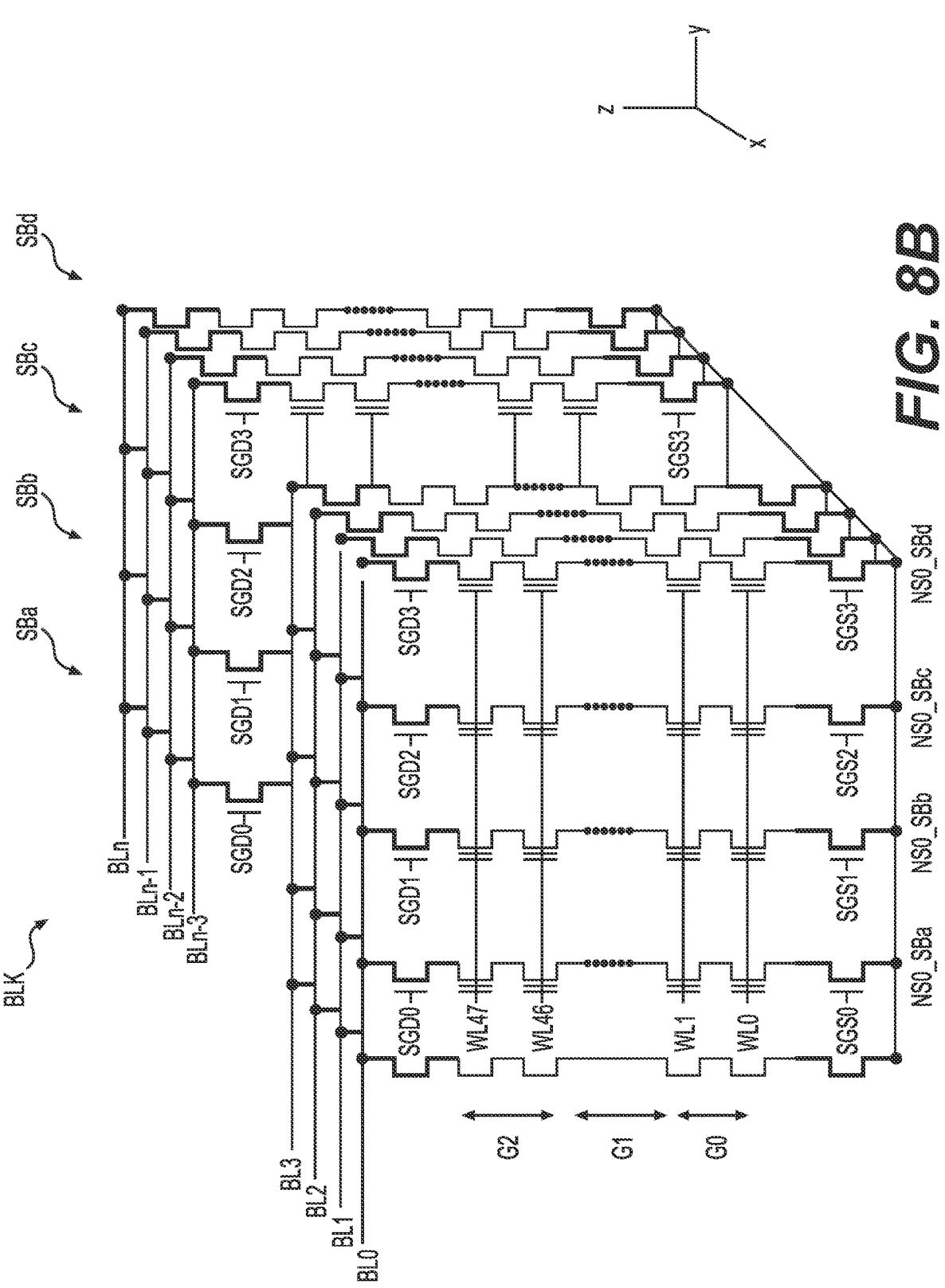
FIG. 8B depicts another example view of NAND strings in sub-blocks according to aspects of the disclosure.

FIG. 8B depicts another example view of NAND strings in sub-blocks. The NAND strings includes NS0_SBa, NS0_SBb, NS0_SBc and NS0_SBd, which have 48 word lines, WL0-WL47, in this example. Each sub-block comprises a set of NAND strings which extend in the x direction and which have a common SGD line, e.g., SGD0, SGD1, SGD2 or SGD3. In this simplified example, there is only one SGD transistor and one SGS transistor in each NAND string. The NAND strings NS0_SBa, NS0_SBb, NS0_SBc and NS0_SBd are in sub-blocks SBa, SBb, SBc and SBd, respectively. Further, example, groups of word lines G0, G1 and G2 are depicted.

Figure 8C:
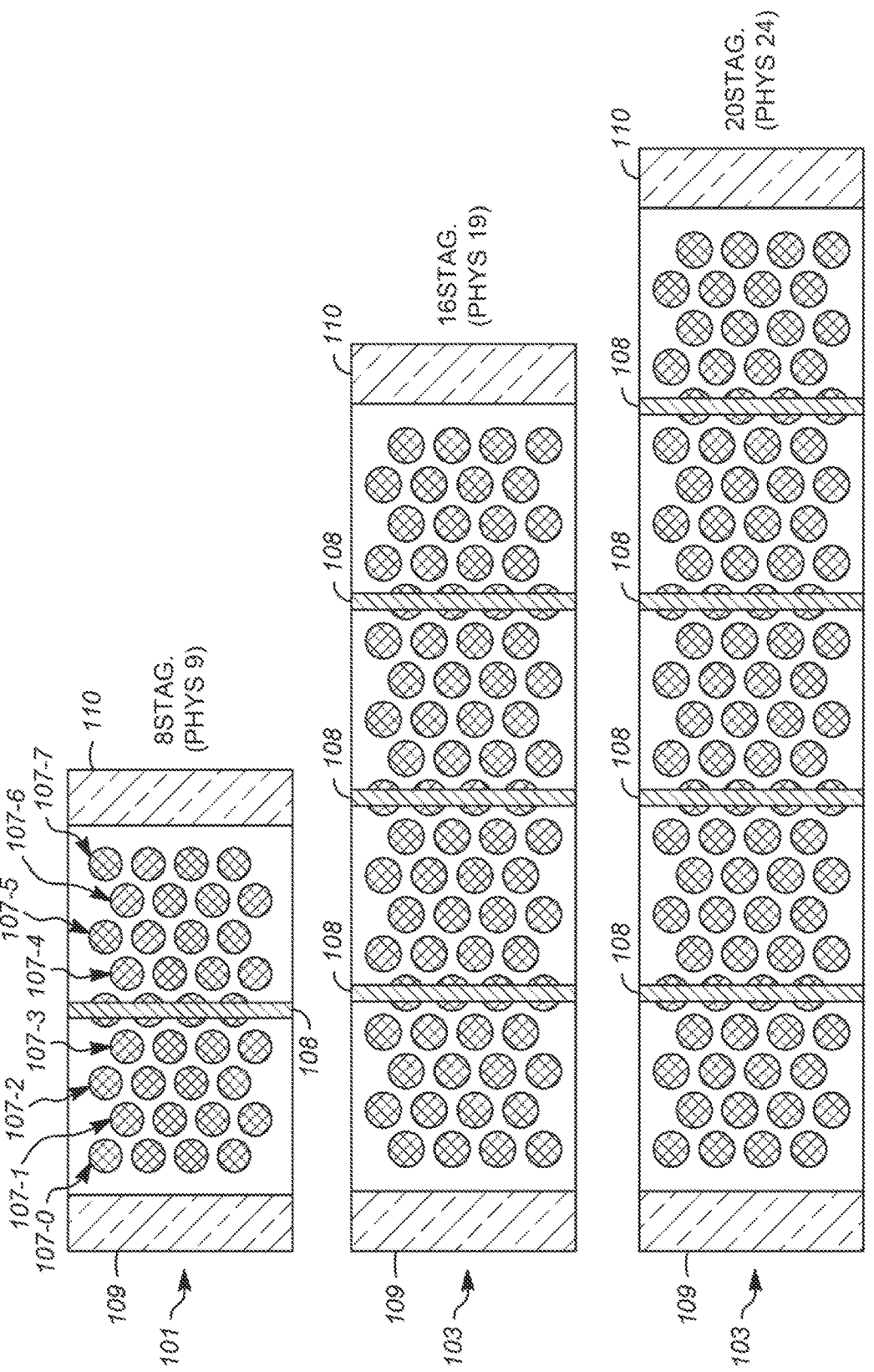
FIG. 8C depicts a top view of example word line layers of a stack according to aspects of the disclosure.

FIG. 8C generally illustrates a schematic view of three versions of staggered string architecture 101, 103, 105 for BiCS memory, e.g., NAND. With reference the string architecture 101, the strings are shown in rows 107-0 through 107-7 in architecture 101. Each row is shown with four ends to the strings. A string may be connected to an adjacent string at an end (not visible beneath this view). A first group of rows 107-0 through 107-3 are shown on a left side of a dummy row 108. A second group of rows 107-4 through 107-7 are shown on a right side of the dummy row 108. The dummy row 108 separates the two groups of rows in the staggered eight rows. A source line 109 is positioned at an edge of the first group and is remote from the dummy row 108. A source line 110 is positioned at an edge of the second group and is remote from the dummy row 108 and source line 109.

The staggered string architectures 103, 105 for BiCS memory are similar to that of architecture 101 except additional groups are added. Architecture 103 is double the size of architecture 101 and includes sixteen rows of strings with each group of four rows separated by a dummy row. Architecture 105 is larger than both the architecture 101 and the architecture 103. Architecture 105 includes twenty rows of strings with each group of four rows separated by a dummy row 108.

These architectures 101, 103, 105 can include a chip under array structure, e.g., the control circuitry is under the memory array that can include the groups of memory strings. With the chip under array structure, the strings may include a direct strap contact for the source line for read and erase operations.

Figure 12:
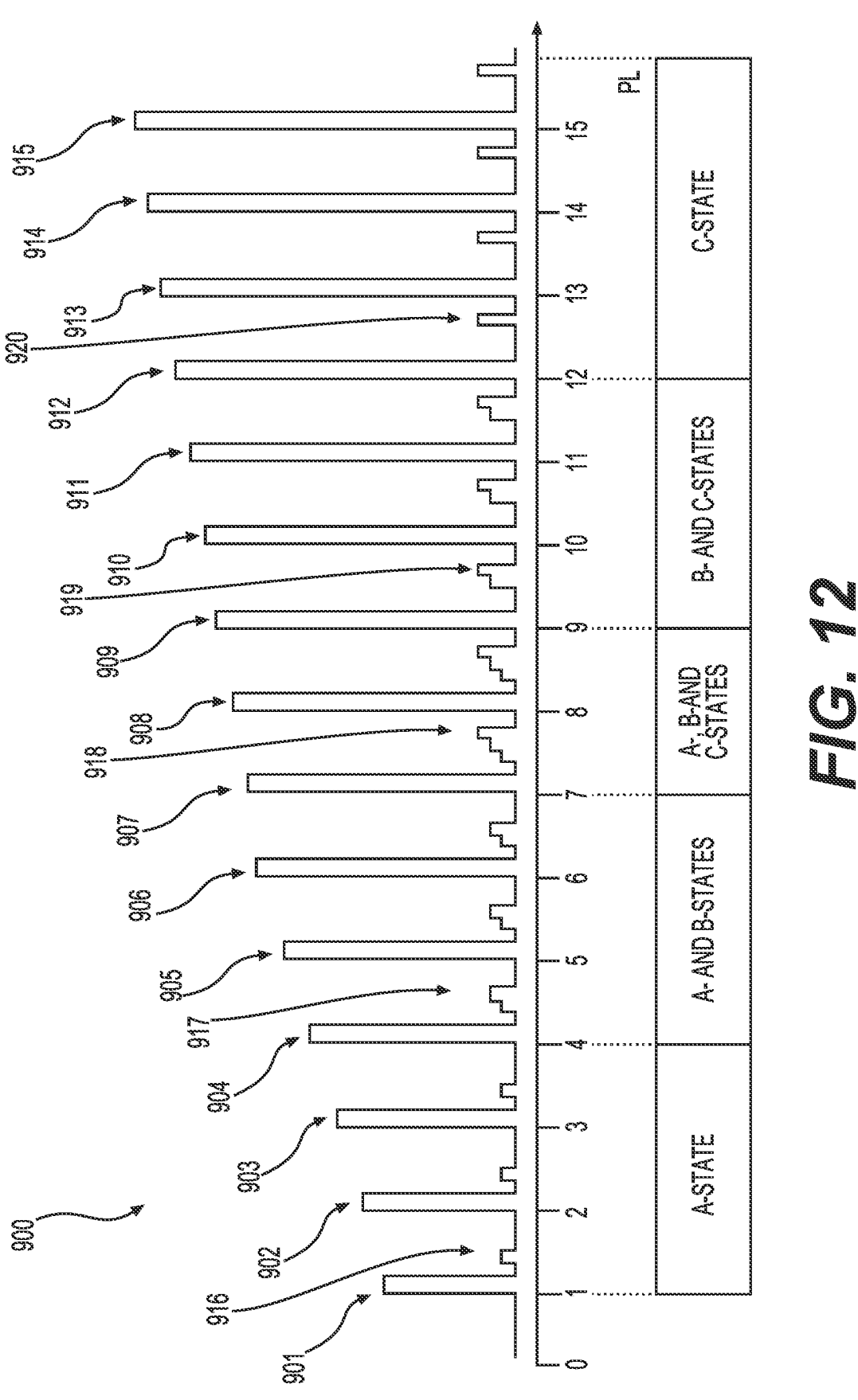
FIG. 12 is a flowchart of an example programming operation in a memory device according to aspects of the disclosure.

FIG. 12 depicts a waveform of an example programming operation. The horizontal axis depicts a program loop number and the vertical axis depicts control gate or word line voltage. Generally, a programming operation can involve applying a pulse train to a selected word line, where the pulse train includes multiple program loops or program-verify (PV) iterations. The program portion of the program-verify iteration comprises a program voltage, and the verify portion of the program-verify iteration comprises one or more verify voltages.

For each program voltage, a square waveform is depicted for simplicity, although other shapes are possible such as a multilevel shape or a ramped shape. Further, Incremental Step Pulse Programming (ISPP) is used in this example, in which the program voltage steps up in each successive program loop. This example uses ISPP in a single programming stage in which the programming is completed. ISPP can also be used in each programming stage of a multi-stage operation.

A pulse train typically includes program voltages which increase stepwise in amplitude in each program-verify iteration using a fixed of varying step size. A new pulse train can be applied in each programming stage of a multi-stage programming operation, starting at an initial Vpgm level and ending at a final Vpgm level which does not exceed a maximum allowed level. The initial Vpgm levels can be the same or different in different programming stages. The final Vpgm levels can also be the same or different in different programming stages. The step size can be the same or different in the different programming stages. In some cases, a smaller step size is used in a final programming stage to reduce Vth distribution widths.

The pulse train 900 includes a series of program voltages 901, 902, 903, 904, 905, 906, 907, 908, 909, 910, 911, 912, 913, 914 and 915 that are applied to a word line selected for programming, and an associated set of non-volatile memory cells. One, two or three verify voltages are provided after each program voltage as an example, based on the target data states which are being verified. 0 V may be applied to the selected word line between the program and verify voltages. For example, an A-state verify voltage of VvA (e.g., waveform or programming signal 916) may be applied after each of second and third program voltages 901, 902 and 903, respectively. A- and B-state verify voltages of VvA and VvB (e.g., programming signal 917) may be applied after each of the fourth, fifth and sixth program voltages 904, 905 and 906, respectively. A-, B- and C-state verify voltages of VvA, VvB and VvC (e.g., programming signal 918) may be applied after each of the seventh and eighth program voltages 907 and 908, respectively. B- and C-state verify voltages of VvB and VvC (e.g., programming signal 919) may be applied after each of the ninth, tenth and eleventh program voltages 909, 910 and 911, respectively. Finally, a C-state verify voltage of VvC (e.g., programming signal 1020) may be applied after each of the twelfth, thirteenth, fourteenth and fifteenth program voltages 912, 913, 914 and 915, respectively.

Figures 13A, 13B:
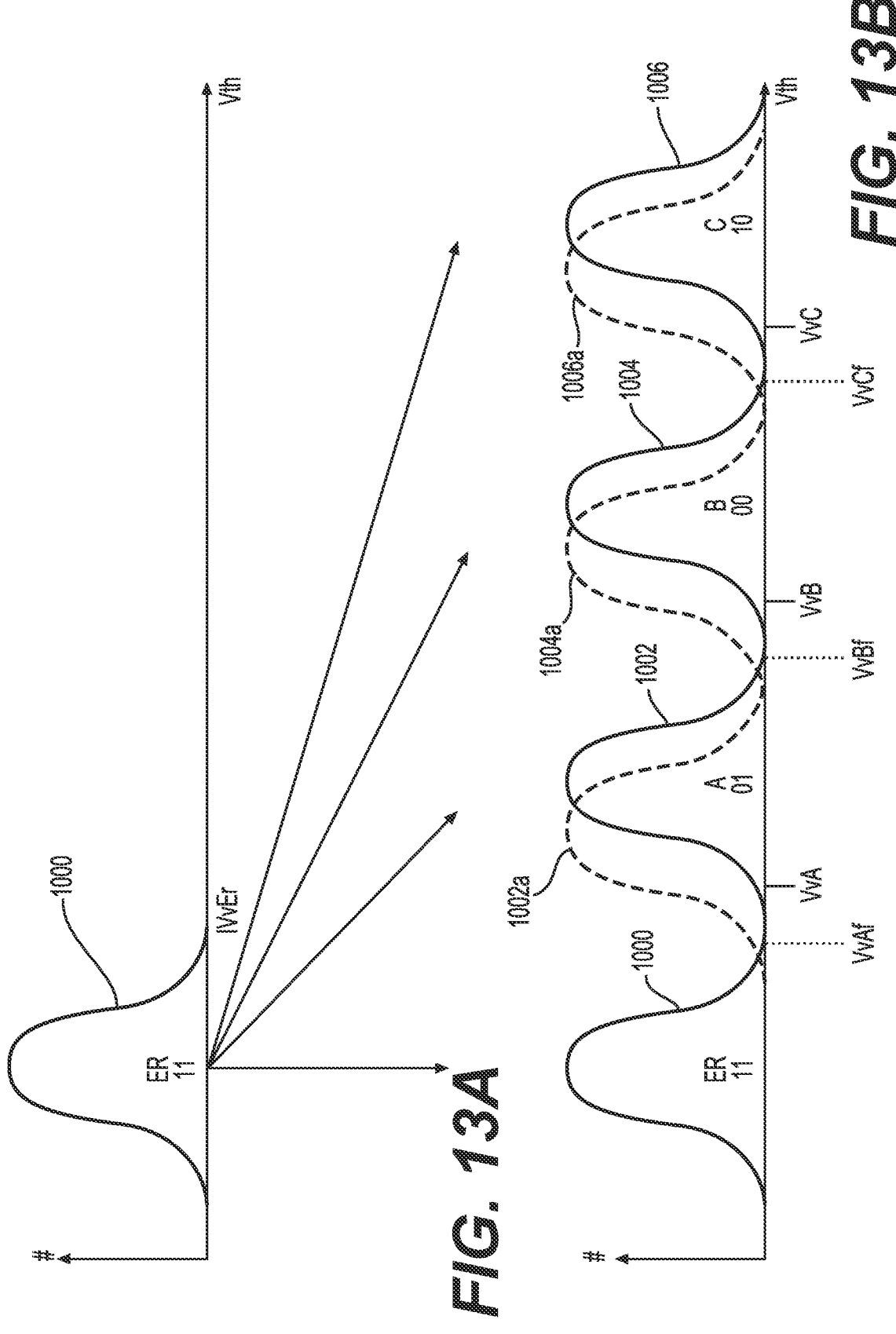
FIGS. 13A and 13B depict the Vth distributions of memory cells according to aspects of the disclosure.

FIGS. 13A and 13B show threshold voltage (Vth) distributions of memory cells in an example two-stage programming operation. Specifically, the memory cells are initially in the erased state (bits 11) as represented by the Vth distribution 1000 shown in FIG. 13A. FIG. 13B depicts Vth distributions of memory cells after a first programming stage and a second programming stage of the example two-stage programming operation with four data states. While two programming stages and four data states are shown, it should be appreciated that any number of programming stages may be utilized (e.g., three or four programming stages) and any number of data states are contemplated.

In the example, the first programming stage causes the Vth of the A, B and C state cells to reach the Vth distributions 1002 a, 1004 a and 1006 a, using first verify voltages of VvAf, VvBf and VvCf, respectively. This first programming stage can be a rough programming which uses a relatively large step size, for instance, so that the Vth distributions 1002 a, 1004 a and 1006 a are relatively wide. The second programming stage may use a smaller step size and causes the Vth distributions 1002 a, 1004 a and 1006 a to transition to the final Vth distributions 1002, 1004 and 1006 (e.g., narrower than Vth distributions 1002 a, 1004 a and 1006 a), using second verify voltages of VvA, VvB, and VvC, respectively. This two-stage programming operation can achieve relatively narrow Vth distributions. A small number of A, B and C state cells (e.g., smaller than a predetermined number of the plurality of memory cells) may have a Vth which is below VvA, VvB or VvC, respectively, due to a bit ignore criteria.

A 3D stacked non-volatile memory device can be arranged in multiple blocks, where typically an erase operation is performed one block at a time. An erase operation can include multiple erase-verify iterations which are performed until an erase-verify condition is met for the block, at which point the erase operation ends. One approach is for the erase-verify condition to allow a predetermined number of fail bits. That is, the erase operation can be declared to be successful even if a small number of memory cells have not reached the erase state. However, this approach does not inhibit fast-erasing memory cells from over-erase. As a result, over-erase of some of the memory cells can occur, causing serious degradation of the memory cells as excessive holes are accumulated in the tunneling path.

However, unlike a 2D NAND structure, where a p-well substrate is common for all blocks, 3D stacked non-volatile memory devices have an individual thin poly-silicon body for each NAND string channel, whose bias can be controlled by bit line (BL), source line (SL), drain-side select gate (SGD) and source-side select gate (SGS) voltages. In a normal erase operation, referred to as a two-sided erase, gate-induced drain leakage (GIDL) currents are generated at both the SGD and SGS transistors. The BL and SL are biased at Verase (VERA), and SGD and SGS are biased at Vsg. In one approach, once all the memory cells associated with the same bit line pass an erase-verify test (e.g., reach the erase state), the associated bit line voltage is reduced to Vsg+ (0"2V), so that no GIDL current is generated at the next erase pulse at the bit line/drain side. Meanwhile, the source line voltage is also reduced to Vsg+(0 {tilde over ( )}2V) so that, for all channels, there will be no GIDL current generated at the source line side for all the following erase pulses of the erase operation. Thus, erase inhibit is achieved for the memory cells which pass the erase-verify test, while those that did not pass are then erased by GIDL current generated at the bit line side only, in a one-sided erase. This avoids over erase of the cells which reach the erase state relatively quickly.

To further help avoid over erase, embodiments described herein are directed to a string-based erase inhibit. For example, during an erase-verify iteration of an erase operation, a memory string may be inhibited or unselected once the memory string passes the erase-verify test. In some embodiments, a memory string may be inhibited by initiating ramp up, to an erase voltage, of a voltage applied to a gate of a SGD transistor of the memory string before initiating ramp up, to the erase voltage, of a voltage applied to a bit line connected to a drain-side end of the memory string. In some embodiments, a memory string may be inhibited by initiating ramp up, to the erase voltage, of a voltage applied to a gate of a SGS transistor of the one memory string before initiating ramp up, to the erase voltage, of a voltage applied to a source line connected to a source-side end of the memory string.

For erase-inhibiting on memory strings, VERA bias needs to be completely cutoff on unselected memory strings. To achieve this, embodiments described herein provide these improvements over a conventional erase sequence including ramping up to cut off SGD of unselected memory strings during the erase operation, and offset of ramp up timing on SGS and SGD before holes that are generated by GIDL run into the memory strings. Shifting of ramp up timing on SGS and SGD on unselected memory strings can help to cut-off VERA bias. Further, embodiments described herein provide for a well-controlled erase state, which allows for less disturb induced by neighbor word-lines and less degradation of data retention. In addition, embodiments described herein decrease the possibility of hitting erase saturation on a memory cell, which improves memory cell reliabilities.

Figures 14A, 14B:
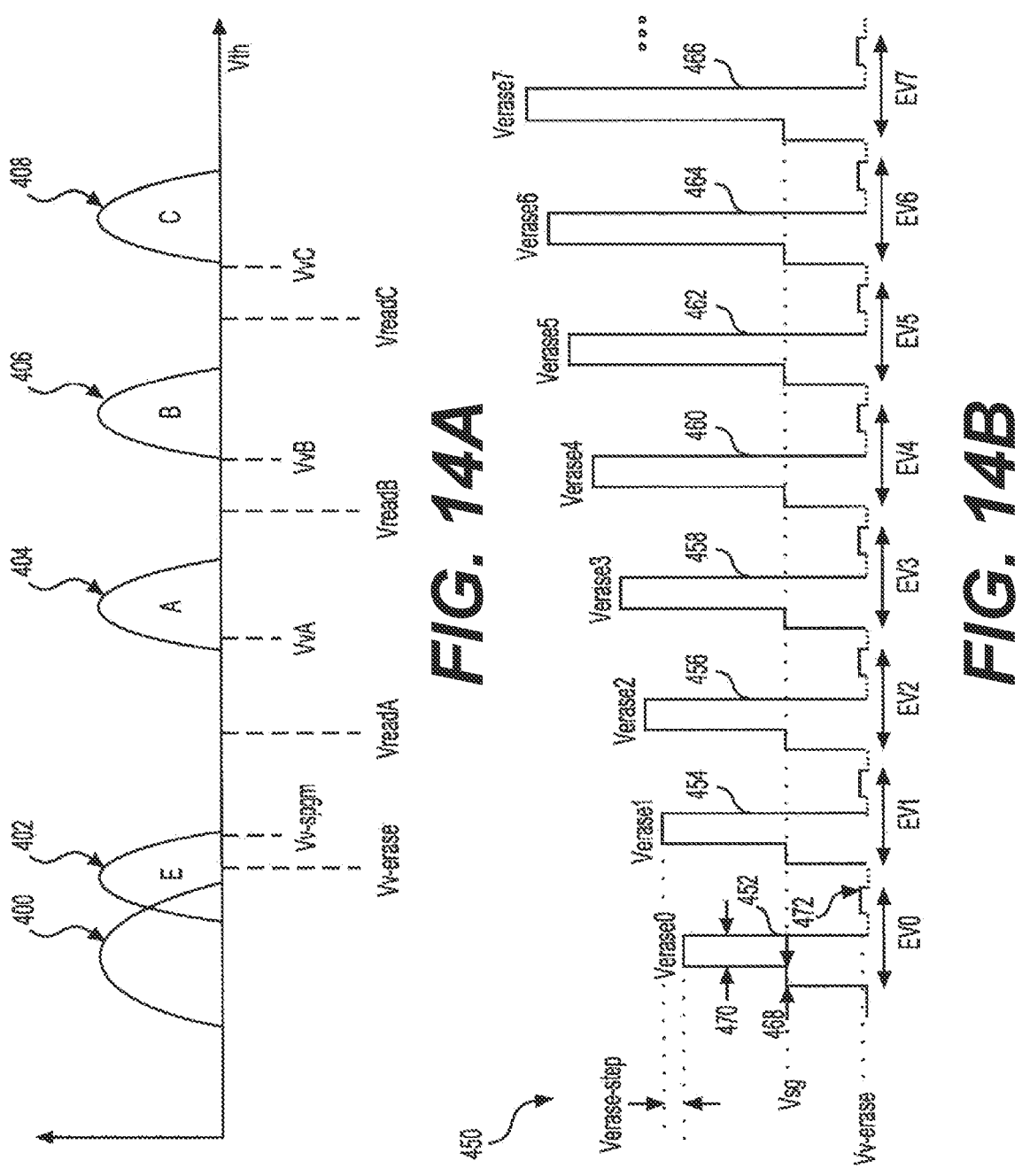
FIG. 14A depicts threshold voltage distributions of an erased state and higher data states according to aspects of the disclosure.
FIG. 14B depicts a series of erase pulses and verify pulses in an erase operation according to aspects of the disclosure.

FIG. 14A depicts threshold voltage distributions of an erased state and higher data states. As mentioned, memory cells can be programmed so that their threshold voltages are in respective ranges which represent data states. Initially, an erase operation is performed which places all of the memory cells in the erased state (E). Subsequently, some of the memory cells can be programmed to a higher threshold voltage such as to represent the A, B or C data states.

The x-axis indicates a threshold voltage and the y-axis indicates a number of storage elements. In this example, there are four data states (each represented by a threshold voltage distribution): an initial erased state 400, a soft programmed erased state (E) 402, an A state 404, a B state 406 and a C state 408. Memory devices with additional data states, e.g., eight or sixteen data states, can also be used. The distribution 400 is realized after the erase operation when storage elements are typically over-erased, past the erase state 402. In the erase operation, one or more erase pulses are applied to the NAND string at its source and/or drain ends, until the threshold voltage of the storage elements being erased transitions below an erase-verify level, Vv-erase which can be 0 V or close to 0V, in one approach. Once the erase operation is completed for a block, the soft programming operation is performed, in which one or more positive voltage pulses are applied to the control gates of the storage elements, such as via a word line, to increase the threshold voltages of some or all of the storage elements in the distribution 400 closer to and below a soft programming (SPGM) verify level, Vv-spgm, to the erased state 402. For example, a certain, small fraction of the storage elements may be soft programmed to have a Vth above Vv-spgm, at which point the soft programing ends, leaving most of the other storage elements with a Vth which is close to, but below, Vv-spgm. Vv-spgm is typically above or equal to Vv-erase. The soft programming operation advantageously results in a narrow erase state distribution 402. Once the soft programming operation is complete, programming to higher data states can occur, such as to states A, B and C using verify levels VvA, VvB and VvC, respectively. A subsequent read operation can use the levels VreadA, VreadB and VreadC. A set erase-verify condition can be met based on whether one or more memory cells have a Vth below Vv-erase.

FIG. 14B depicts a series 450 of erase pulses (Verase0 to Verase7) and verify pulses (see, e.g., example erase-verify pulse 472) in an erase operation. The erase pulses and verify pulses are presented together for understanding although they are applied to different portions of the memory device. An erase operation can include multiple erase-verify itera-tions, e.g., EV0 to EV7. Each erase-verify iteration can include an erase portion followed by a verify portion. Examples erase portions 452, 454, 456, 458, 460, 462, 464 and 466 are provided for erase-verify iterations EV0, EV1, EV2, EV3, EV4, EV5, EV6 to EV7. Example verify portion 472 having an amplitude of Vv-erase follows erase portion 452. In the erase portion, an erase pulse or voltage is applied to one or both ends of a NAND string. Each erase portion can have a first portion which is applied in a preparation phase, and a second portion which is applied in charge up and erase phases, as discussed further below. For example, erase portion 452 has a first portion 468 and a second portion 470. In this example, the first portion of each erase portion has an amplitude of Vsg (an initial lower level), and the second portions of the erase portions have amplitudes (sub-sequent peak levels) of Verase0, Verase1, Verase2, Verase3, Verase4, Verase5, Verase6 and Verase7, which increase according to a step size of Verase-step.

The erase pulses can thus step up in amplitude in each iteration, in one approach. In the verify portion, a determi-nation is made as to whether the Vth of a selected memory cell which is to be erased has fallen below Vv-erase. This can include determining whether the selected memory cell is in a conductive state when a word line voltage of Vv-erase is applied to the selected memory cell. If the selected memory cell is in a conductive state, Vth<Vv-erase and the selected memory cell has been erased. If the selected memory cell is in a non-conductive state, Vth>Vv-erase and the selected memory cell has not yet been erased.

Figure 15:
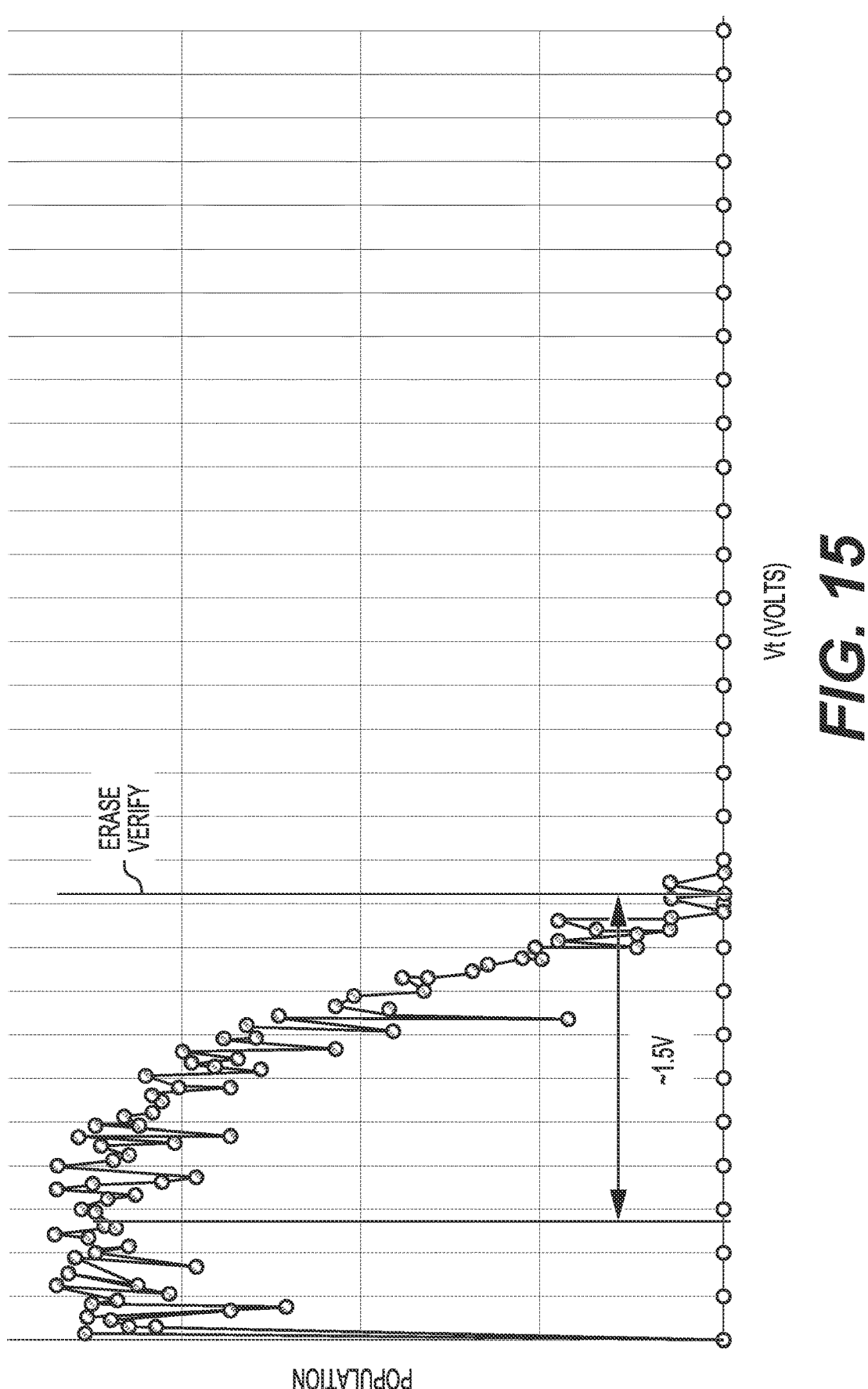
FIG. 15 shows an example memory cell threshold distribution Vt distribution after an erase operation according to aspects of the disclosure.

As discussed, block-by-block erase operations do not prevent fast-erasing memory cells from becoming "over-erased". FIG. 15 shows an example memory cell threshold distribution Vt distribution after an erase operation. As shown, the whole threshold distribution Vt width is more than 3V, which means the lower tail memory cells are "over erased" approximately 3V more than the erase verify level. These memory cells suffer reliability issues including worse endurance caused by high erase stress and worse lateral data retention caused by deep erase (parasitic holes between word lines). Typically, an erase operation completes after two loops, thus two erase loops are used as an example to elaborate erase operations below. However, it should be appreciated that the erase operations contemplated herein may utilize any number of loops. For conventional erase operations without inhibiting, all memory cells in one block are erased concurrently, no cell inhibit during erasing. FIG. 16 shows a threshold voltage distribution of memory cells in a first loop (top of FIG. 16) and a second loop (bottom of FIG. 16) of a conventional erase without inhibit. All memory cells are erased by a common or first erase voltage Vera1 in the first loop of the conventional erase operation without inhibit. After the first erase voltage Vera1 pulse, an erase verify is done. Some memory cells pass erase verify (i.e., threshold voltage Vt<a target erase verify level voltage Vev) and the other memory cells do not pass erase verify (i.e., threshold voltage Vt<the target erase verify level voltage Vev). In the second loop of the conventional erase operation without inhibit, all memory cells (both passed cells and cells that did not pass erase verify) are further erased by a second erase voltage Vera2 until all the memory cells pass erase verify, then the erase operation is finished.

In another conventional erase operation with inhibit, all memory cells are erased by a common or first erase voltage Vera1 in the first loop of the conventional erase operation for selected strings which need to be erased. FIG. 17 shows a threshold voltage distribution of memory cells in the first loop (top of FIG. 17) and the second loop (bottom of FIG. 17) of a conventional erase with inhibit. After the first erase voltage Vera1 pulse, an erase verify is done, some cells pass erase verify (Inhibit zone) and the other cells do not pass erase verify (Erase zone). In the second loop of the conven-tional erase operation with inhibit, for the memory cells in erase zone which have not passed verify and need further erase, their bit lines are biased as the second erase voltage Vera2 to normally erase them during the second loop. For the memory cells in inhibit zone which have passed verify and do not need to be erased any more, their bit lines are biased as (Vera2–Vinhibit) during the second loop. The voltage should be low enough to make sure no GIDL happens for the memory cells in inhibit zone, then the memory cells in inhibit zone are inhibited during the second loop. For unselected strings which do not need be erased, the unselected top drain-side select gate transistor (e.g., SGD transistors 680 in FIG. 6D) is biased as the first erase voltage Vera1 in the first loop and the second erase voltage Vera2 in the second loop, then the memory cells of unselected strings will be inhibited during the first and second loops of the erase operation. Based on the erase inhibit, a narrower threshold voltage Vt distribution can be achieved compared to the conventional erase without inhibit. However, further improvement in the threshold voltage distribution width after the erase operation is desirable.

Figures 9, 10, 11:
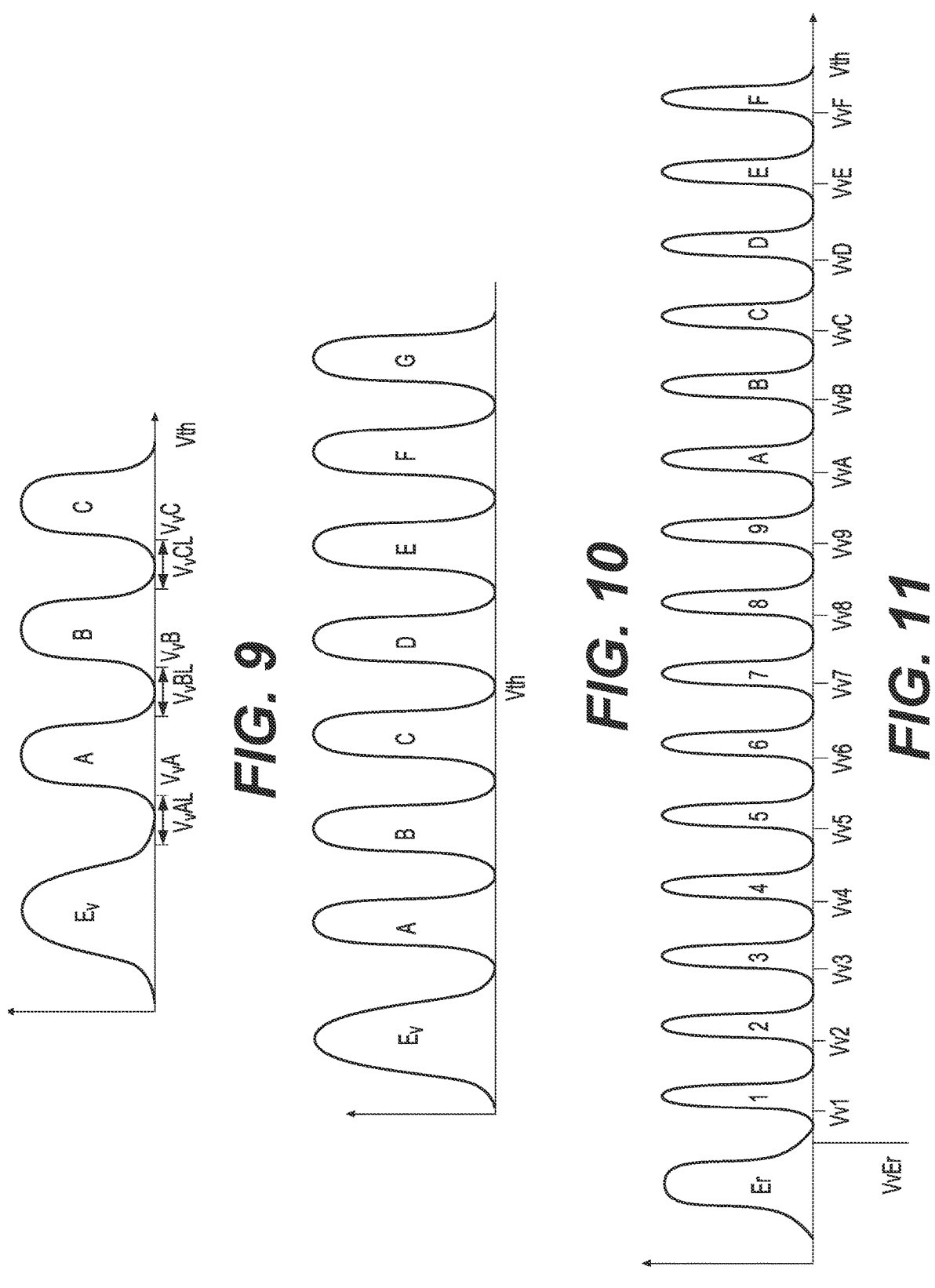
FIG. 9 depicts the Vth distributions of memory cells in an example one-pass programming operation with four data states according to aspects of the disclosure.
FIG. 10 depicts the Vth distributions of memory cells in an example one-pass programming operation with eight data states according to aspects of the disclosure.
FIG. 11 depicts the Vth distributions of memory cells in an example one-pass programming operation with sixteen data states according to aspects of the disclosure.

Consequently, described herein is a memory apparatus (e.g., memory device 100 in FIG. 1A) including memory cells (e.g., data memory cell MC in FIG. 6D) configured to retain a threshold voltage Vth corresponding to one of a plurality of data states (e.g., the Er, A, B and C data states in FIG. 9, the Er, A, B, C, D, E, F and G data states in FIG. 10, the Er, 1, 2, 3, 4, 5, 6, 7, 8, 9, A, B, C, D, E and F data states in FIG. 11). The memory cells are disposed in memory holes (e.g., memory hole 630 in FIG. 6D) each defining a channel (e.g., channel 665 in FIG. 6D). The memory appa-ratus also includes a control means (e.g., control circuitry 110, controller 122, decoders 124, 132, read/write circuits

128, and sense blocks SB1, SB2, SBp in FIG. 1A) configured to apply a first one of a plurality of erase pulses of a first erase voltage Vera1 to the channel of each of the memory holes including the memory cells being erased in a first loop of an erase operation. The control means verifies the threshold voltage of the memory cells being erased using a target erase verify level voltage Vev and at least one high erase verify level voltage Vev_h, Vev_h1, Vev_h2 higher than the target erase verify level voltage Vev. The control means is also configured to slow erasing of ones of the memory cells being erased in a second loop of the erase operation in response to the threshold voltage of the ones of the memory cells being erased being greater than the target erase verify level voltage Vev and less than the at least one high erase verify level voltage Vev_h, Vev_h1, Vev_h2. Such an approach will be referred herein as a quick pass erase (QPE).

According to other aspects and in further detail, the control means is additionally configured to not slow erasing ones of the memory cells being erased in the second loop of the erase operation in response to the threshold voltage of the ones of the memory cells being erased being greater than the at least one high erase verify level voltage Vev_h, Vev_h1, Vev_h2. The control means can also completely inhibit erasing ones of the memory cells being erased in the second loop of the erase operation in response to the threshold voltage of the ones of the memory cells being erased being less than the target erase verify level voltage Vev. As discussed above, the memory holes may be grouped into a plurality of strings (e.g., sub-blocks SBa-SBd in FIGS. 7A and 8B). Thus, the control means may be further configured to completely inhibit erasing of ones of the memory cells disposed in unselected ones of the plurality of strings not being erased during the erase operation.

Figure 19:
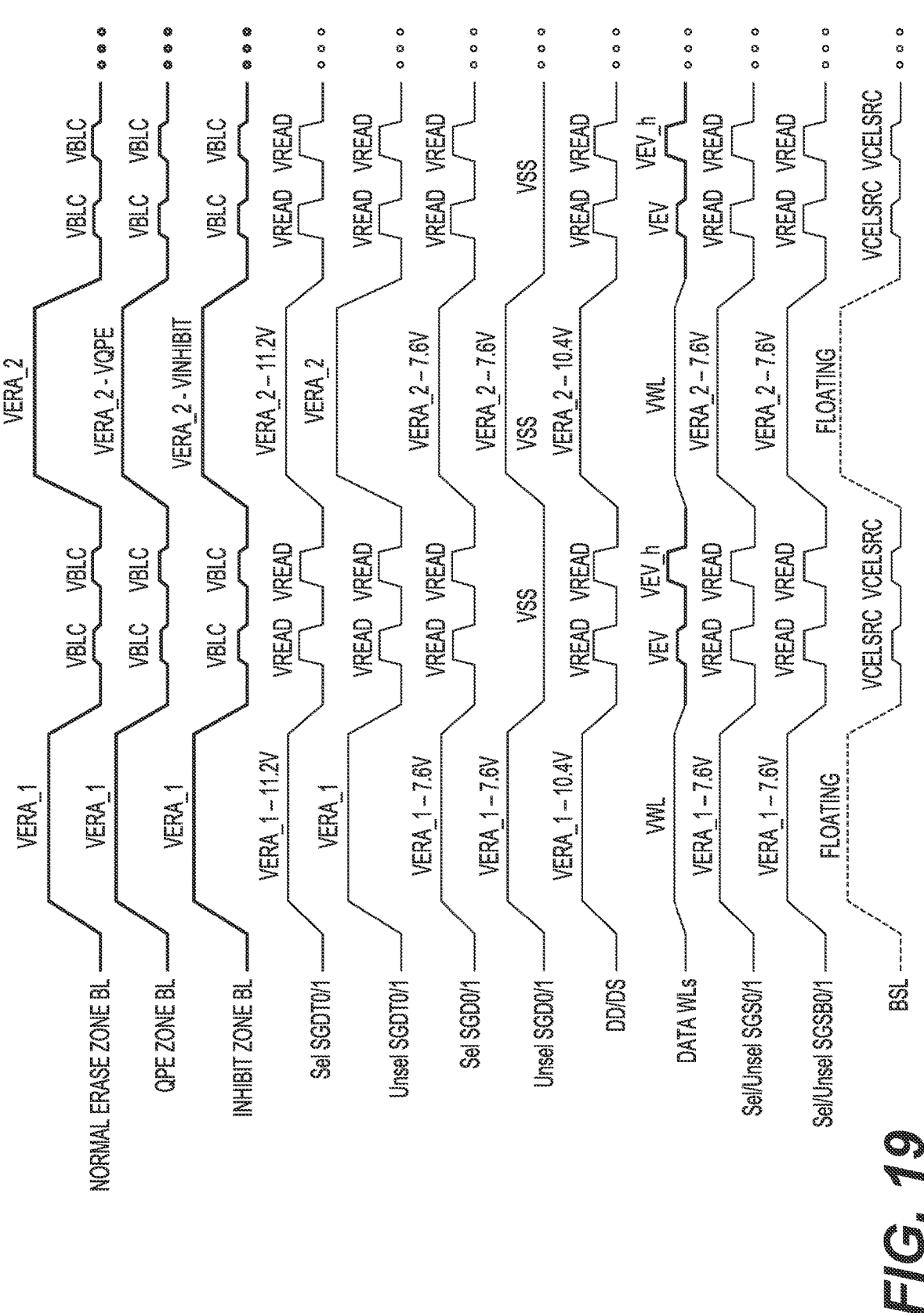
FIG. 19 shows waveforms of various voltages applied to the memory apparatus during an example single zone quick pass erase operation according to aspects of the disclosure.

As discussed above, the memory holes may each be connected to one of a plurality of bit lines (e.g., bit line BL0 in FIG. 6B) coupled to the control means. According to an aspect, the at least one high erase verify level voltage Vev_h, Vev_h1, Vev_h2 only includes a single high erase verify level voltage Vev_h. So, the quick pass erase can be a single zone quick pass erase. FIG. 18 shows a threshold voltage distribution of memory cells in the first loop (top of FIG. 18) and the second loop (bottom of FIG. 18) of the single zone quick pass erase. In the single quick pass erase, for a selected string which needs to be erased, in the first loop, all memory cells are erased by a common or first erase voltage Vera1. After the first pulse of the first erase voltage Vera1, an erase verify is done with two verify levels, the target erase verify level voltage Vev and the single high erase verify level voltage Vev_h (Vev is the target erase verify level, Vev_h is a higher verify level). As shown in FIG. 18, some cells pass the target erase verify level voltage Vev (Inhibit zone), some cells do not pass the target erase verify level voltage Vev, but pass the single high erase verify level voltage Vev_h (QPE zone), and the other memory cells do not pass the single high erase verify level voltage Vev_h (Erase zone). For the cells in erase zone which have not passed the single high erase verify level voltage Vev_h, it means the memory cells are far from the target verify level voltage Vev, so their bit lines should be biased as the second erase voltage Vera2 to normally erase them during the second loop. So, in the second loop of the single zone quick pass erase, the control means is configured to apply a second one of the plurality of erase pulses of a second erase voltage Vera2 greater than the first erase voltage Vera1 to ones of the plurality of bit lines coupled to the ones of the memory cells having the threshold voltage greater than the single high erase verify level voltage Vev_h in the second loop of the erase operation. For the memory cells in QPE zone which have passed the single high erase verify level voltage Vev_h, but not passed the target erase verify level voltage Vev, it means the memory cells are close to the target erase verify level voltage Vev, so their bit lines should be biased as the second erase voltage Vera2 minus a single quick pass erase voltage Vqpe to slow down erase the cells during the second loop. Therefore, the control means is additionally configured to apply the second one of the plurality of erase pulses of the second erase voltage Vera2 minus the single quick pass erase voltage Vqpe to ones of the plurality of bit lines coupled to the ones of the memory cells having the threshold voltage less than the single high erase verify level voltage Vev_h and greater than the target erase verify level voltage Vev to slow erasing in the second loop of the erase operation. For the memory cells in inhibit zone which have passed the target erase verify level voltage Vev and no need to be erased any more, their bit lines should be biased as the second erase voltage Vera2 minus an inhibit erase voltage Vinhibit during the second loop. The voltage should be low enough to make sure no GIDL happened for the memory cells in inhibit zone, then memory cells in inhibit zone are inhibited during second loop. Here, Vera2>(Vera2−Vqpe)>(Vera2−Vinhibit). Thus, the control means is also configured to apply the second one of the plurality of erase pulses of the second erase voltage Vera2 minus an inhibit erase voltage Vinhibit to ones of the plurality of bit lines coupled to the ones of the memory cells having the threshold voltage less than the target erase verify level voltage Vev to completely inhibit erasing in the second loop of the erase operation. For unselected strings which do not need to be erased, the unselected top drain-side select gate transistors (e.g., SGD transistors 680 in FIG. 6D) are biased as the first erase voltage Vera1 in the first loop and the second erase voltage Vera2 in the second loop to inhibit erasing of the memory cells of unselected during the first loop and the second loop. With the single zone QPE mode, the erase threshold voltage Vt distribution can be further narrowed, as shown in in FIG. 18. FIG. 19 shows waveforms of various voltages applied to the memory apparatus during an example single zone quick pass erase operation. For example, the erase voltages Vera1, Vera2 can be approximately 18 volts, the bit line voltages Vblc can be approximately 0.9 volts, the read pass voltage Vread can be approximately 6.5 volts, the source line voltage Vcelsrc can be approximately 0.5 volts, the target erase verify level voltage Vev can be approximately 0.5 volts, the single high erase verify level voltage Vev_h can be approximately 0.1 volts, the inhibit erase voltage Vinhibit can be approximately 7.6 volts, and the single quick pass erase voltage Vqpe can be approximately 0.8 volts. It should be appreciated that these voltages are only examples and that other voltages are contemplated.

Figure 20:
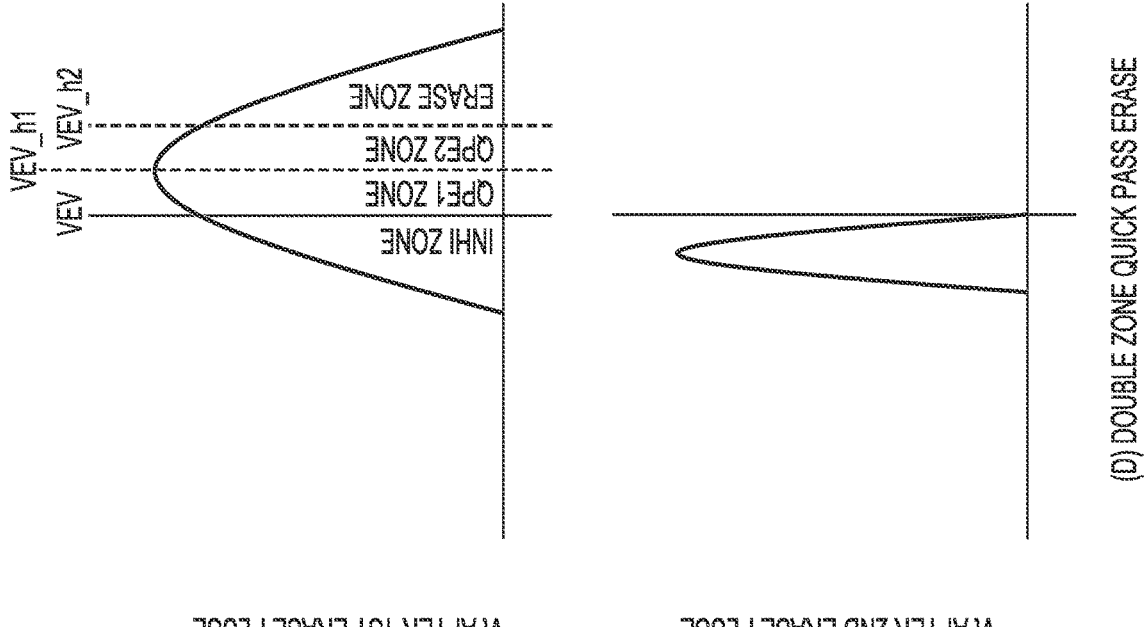
FIG. 20 shows a threshold voltage distribution of memory cells in the first loop and the second loop of a double zone quick pass erase according to aspects of the disclosure.
Figure 21:
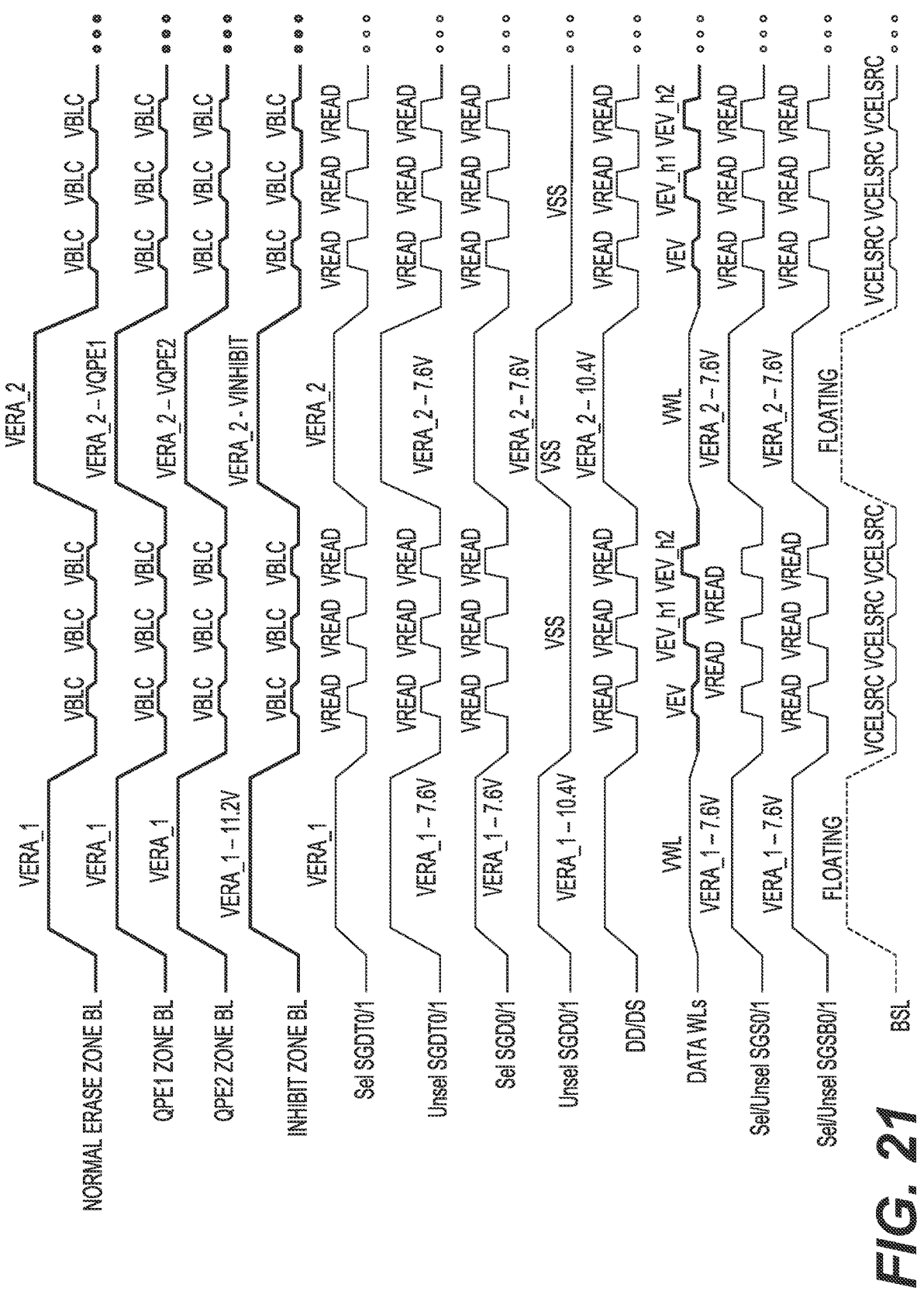
FIG. 21 shows waveforms of various voltages applied to the memory apparatus during an example double zone quick pass erase operation according to aspects of the disclosure.

The at least one high erase verify level voltage Vev_h, Vev_h1, Vev_h2 can include a first double high erase verify level voltage Vev_h1 and a second double high erase verify level voltage Vev_h2 greater in magnitude than the first double high erase verify level voltage Vev_h1. In other words, the quick pass erase can be a double zone quick pass erase. FIG. 20 shows a threshold voltage distribution of memory cells in the first loop (top of FIG. 20) and the second loop (bottom of FIG. 20) of the double zone quick pass erase. In the double quick pass erase, for a selected string which needs to be erased, in the first loop, all memory cells are erased by the common or first erase voltage Vera1. After the first pulse of the first erase voltage Vera1, an erase verify is done with three verify level the target erase verify level voltage Vev, the first double high erase verify level voltage Vev_h1, and the second double high erase verify level voltage Vev_h2 (Vev is the target erase verify level, Vev_h1/ Vev_h2 are two higher verify levels, Vev<Vev_h1<Vev_h2). As shown in FIG. 20, some cells pass the target erase verify level voltage Vev (Inhibit zone), some cells do not pass target erase verify level voltage Vev but pass Vev_h1 (QPE2 zone), some cells do not pass the first double high erase verify level voltage Vev_h1, but pass Vev_h2 (QPE1 zone), and the other cells do not pass the second double high erase verify level voltage Vev_h2 (Erase zone), as shown in FIG. 20. For the memory cells in erase zone which have not passed the second double high erase verify level voltage Vev_h2, it means the memory cells are far from the target erase verify level voltage Vev, so their bit lines should be biased as the second erase voltage Vera2 to normally erase them during the second loop. Thus, in the second loop of the double zone quick pass erase, the control means is configured to apply a second one of the plurality of erase pulses of a second erase voltage Vera2 greater than the first erase voltage Vera1 to ones of the plurality of bit lines coupled to the ones of the memory cells having the threshold voltage greater than the second double high erase verify level voltage Vev_h2 in the second loop of the erase operation. For the cells in the QPE1 zone which have passed the second double high erase verify level voltage Vev_h2, but not passed the first double high erase verify level voltage Vev_h1, it means the memory cells are close to the target erase verify level voltage Vev, so their bit lines should be biased as the second erase voltage Vera2 minus a first double quick pass erase voltage Vqpe1 to slowdown the erasing of the memory cells during the second loop. So, the control means is further configured to apply the second one of the plurality of erase pulses of the second erase voltage Vera2 minus a first double quick pass erase voltage Vqpe1 to ones of the plurality of bit lines coupled to the ones of the memory cells having the threshold voltage less than the second double high erase verify level voltage Vev_h2 and greater than the first double high erase verify level voltage Vev_h1 to slow erasing at a first rate in the second loop of the erase operation. For the memory cells in QPE2 zone which have passed the first double high erase verify level voltage Vev_h1, but not passed the target erase verify level voltage Vev, it means the memory cells are very close to the target erase verify level voltage Vev, so their bit lines should be biased as the second erase voltage Vera2 minus a second double quick pass erase voltage Vqpe2 to slowdown erase the cells during second loop. Accordingly, the control means apply the second one of the plurality of erase pulses of the second erase voltage Vera2 minus a second double quick pass erase voltage Vqpe2 to ones of the plurality of bit lines coupled to the ones of the memory cells having the threshold voltage less than the first double high erase verify level voltage Vev_h1 and greater than the target erase verify level voltage Vev to slow erasing at a second rate higher than the first rate in the second loop of the erase operation. For the memory cells in inhibit zone which have passed the target erase verify level voltage Vev and do not need to be erased any more, their bit lines should be biased the second erase voltage Vera2 minus an inhibit erase voltage Vinhibit during the second loop. The voltage should be low enough to make sure no GIDL happened for the cells in inhibit zone, then cells in inhibit zone are inhibited during the second loop. Here, Vera2>(Vera2−Vqpe1)>(Vera2−Vqpe2)>(Vera2−Vinhibit). Therefore, the control means is also configured to apply the second one of the plurality of erase pulses of the second erase voltage Vera2 minus an inhibit erase voltage Vinhibit to ones of the plurality of bit lines coupled to the ones of the memory cells having the threshold voltage less than the target erase verify level voltage Vev to completely inhibit erasing in the second loop of the erase operation. For unselected strings which do not need to be erased, the unselected top drain-side select gate transistors are biased as the first erase voltage Vera1 in the first loop and the second erase voltage Vera2 in the second loop to inhibit erasing of the memory cells of unselected during the first loop and the second loop. With the double zone QPE mode, the erase threshold voltage Vt distribution can be further narrowed, as shown in FIG. 20. FIG. 21 shows waveforms of various voltages applied to the memory apparatus during an example double zone quick pass erase operation. Again, for example, the erase voltages Vera1, Vera2 can be approximately 18 volts, the bit line voltages Vblc can be approximately 0.9 volts, the read pass voltage Vread can be approximately 6.5 volts, the source line voltage Vcelsrc can be approximately 0.5 volts, the target erase verify level voltage Vev can be approximately 0.5 volts, the first double high erase verify level voltage Vev_h1 can be approximately 0.1 volts, the second double high erase verify level voltage Vev_h1 can be approximately 0.2 volts, the inhibit erase voltage Vinhibit can be approximately 7.6 volts, the first double quick pass erase voltage Vqpe1 can be approximately 0.6 volts, and the second double quick pass erase voltage Vqpe2 can be approximately 1 volt. It should be appreciated that these voltages are only examples and that other voltages are contemplated.

Now referring to FIG. 22, a method of operating a memory apparatus is also provided. As discussed above, the memory apparatus (e.g., memory device 100 in FIG. 1A) includes memory cells (e.g., data memory cell MC in FIG. 6D) configured to retain a threshold voltage Vth corresponding to one of a plurality of data states (e.g., the Er, A, B and C data states in FIG. 9, the Er, A, B, C, D, E, F and G data states in FIG. 10, the Er, 1, 2, 3, 4, 5, 6, 7, 8, 9, A, B, C, D, E and F data states in FIG. 11). The memory cells are disposed in memory holes (e.g., memory hole 630 in FIG. 6D) each defining a channel (e.g., channel 665 in FIG. 6D). The method includes the step of 2200 applying a first one of a plurality of erase pulses of a first erase voltage Vera1 to the channel of each of the memory holes including the memory cells being erased in a first loop of an erase operation. The method continues by 2202 verifying the threshold voltage of the memory cells being erased using a target erase verify level voltage Vev and at least one high erase verify level voltage Vev_h, Vev_h1, Vev_h2 higher than the target erase verify level voltage Vev. The method also includes the step of 2204 slowing erasing of ones of the memory cells being erased in a second loop of the erase operation in response to the threshold voltage of the ones of the memory cells being erased being greater than the target erase verify level voltage Vev and less than the at least one high erase verify level voltage Vev_h, Vev_h1, Vev_h2.

Again, according to other aspects and in further detail, the method can further include the step of not slowing erasing ones of the memory cells being erased in the second loop of the erase operation in response to the threshold voltage of the ones of the memory cells being erased being greater than the at least one high erase verify level voltage Vev_h, Vev_h1, Vev_h2. The method can also include the step of completely inhibiting erasing ones of the memory cells being erased in the second loop of the erase operation in response to the threshold voltage of the ones of the memory cells being erased being less than the target erase verify level voltage Vev. Again, as discussed, the memory holes may be grouped into a plurality of strings (e.g., sub-blocks SBa-SBd in FIGS. 7A and 8B). Therefore, the method further includes the step of completely inhibiting erasing of ones of the memory cells disposed in unselected ones of the plurality of strings not being erased during the erase operation.

As discussed, the memory holes may each be connected to one of the plurality of bit lines (e.g., bit line BL0 in FIG. 6B). Again, according to an aspect and with reference back to FIGS. 18 and 19, the at least one high erase verify level voltage Vev_h, Vev_h1, Vev_h2 only includes a single high erase verify level voltage Vev_h. Thus, the quick pass erase can be the single zone quick pass erase. Accordingly, the method further includes the step of applying a second one of the plurality of erase pulses of a second erase voltage Vera2 greater than the first erase voltage Vera1 to ones of the plurality of bit lines coupled to the ones of the memory cells having the threshold voltage greater than the single high erase verify level voltage Vev_h in the second loop of the erase operation. The next step of the method is applying the second one of the plurality of erase pulses of the second erase voltage Vera2 minus a single quick pass erase voltage Vqpe to ones of the plurality of bit lines coupled to the ones of the memory cells having the threshold voltage less than the single high erase verify level voltage Vev_h and greater than the target erase verify level voltage Vev to slow erasing in the second loop of the erase operation. The method also includes the step of applying the second one of the plurality of erase pulses of the second erase voltage Vera2 minus an inhibit erase voltage Vinhibit to ones of the plurality of bit lines coupled to the ones of the memory cells having the threshold voltage less than the target erase verify level voltage Vev to completely inhibit erasing in the second loop of the erase operation.

Again, with reference back to FIGS. 20 and 21, the at least one high erase verify level voltage Vev_h, Vev_h1, Vev_h2 can include the first double high erase verify level voltage Vev_h1 and the second double high erase verify level voltage Vev_h2 greater in magnitude than the first double high erase verify level voltage Vev_h1. In other words, the quick pass erase can be a double zone quick pass erase. So, the method further includes the step of applying a second one of the plurality of erase pulses of a second erase voltage Vera2 greater than the first erase voltage Vera1 to ones of the plurality of bit lines coupled to the ones of the memory cells having the threshold voltage greater than the second double high erase verify level voltage Vev_h2 in the second loop of the erase operation. Next, applying the second one of the plurality of erase pulses of the second erase voltage Vera2 minus a first double quick pass erase voltage Vqpe1 to ones of the plurality of bit lines coupled to the ones of the memory cells having the threshold voltage less than the second double high erase verify level voltage Vev_h2 and greater than the first double high erase verify level voltage Vev_h1 to slow erasing at a first rate in the second loop of the erase operation. The method proceeds with the step of applying the second one of the plurality of erase pulses of the second erase voltage Vera2 minus a second double quick pass erase voltage Vqpe2 to ones of the plurality of bit lines coupled to the ones of the memory cells having the threshold voltage less than the first double high erase verify level voltage Vev_h1 and greater than the target erase verify level voltage Vev to slow erasing at a second rate higher than the first rate in the second loop of the erase operation. The method also includes the step of applying the second one of the plurality of erase pulses of the second erase voltage Vera2 minus an inhibit erase voltage Vinhibit to ones of the plurality of bit lines coupled to the ones of the memory cells having the threshold voltage less than the target erase verify level voltage Vev to completely inhibit erasing in the second loop of the erase operation.

Clearly, changes may be made to what is described and illustrated herein without, however, departing from the scope defined in the accompanying claims. The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," "top", "bottom", and the like, may be used herein for ease of description to describe one element's or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptions used herein interpreted accordingly.

What is claimed is:

1. A memory apparatus, comprising:
memory cells configured to store a threshold voltage corresponding to one of a plurality of data states and disposed in memory holes each defining a channel, the channels being each connected to one of a plurality of bit lines; and
a control means configured to:
apply a first erase pulse of a plurality of erase pulses, the first erase pulse including an application of a first erase voltage to the bit lines of each of the memory holes including memory cells being erased in a first loop of an erase operation,
verify the threshold voltage of the memory cells being erased using a target erase verify level voltage and at least one high erase verify level voltage higher than the target erase verify level voltage, and
slow erasing of a first group of the memory cells being erased in a second loop of the erase operation in response to the threshold voltage of the first group of the memory cells being erased being greater than the target erase verify level voltage and less than the at least one high erase verify level voltage.

2. The memory apparatus as set forth in claim 1, wherein the control means is further configured to:
not slow erasing a second group of the memory cells being erased in the second loop of the erase operation in response to the threshold voltage of the ones the second group of the memory cells being erased being greater than the at least one high erase verify level voltage; and
completely inhibit erasing a third group of the memory cells being erased in the second loop of the erase operation in response to the threshold voltage of the third group of the memory cells being erased being less than the target erase verify level voltage.

3. The memory apparatus as set forth in claim 1, wherein the at least one high erase verify level voltage only includes a single high erase verify level voltage.

4. The memory apparatus as set forth in claim 3, wherein the control means is further configured to:
apply a second erase pulse, the second erase pulse including an application of a second erase voltage greater than the first erase voltage to a second group of the plurality of bit lines coupled to a second group of the memory cells having the threshold voltage greater than the single high erase verify level voltage in the second loop of the erase operation;
the second erase pulse further including an application of the second erase voltage minus a single quick pass erase voltage to a first group of the plurality of bit lines coupled to the first group of the memory cells having the threshold voltage less than the single high erase verify level voltage and greater than the target erase verify level voltage to slow erasing in the second loop of the erase operation; and the second erase pulse further including an application of the second erase voltage minus an inhibit erase voltage to a third group of the plurality of bit lines coupled to a third group of the memory cells having the threshold voltage less than the target erase verify level voltage to completely inhibit erasing in the second loop of the erase operation.

5. The memory apparatus as set forth in claim 1, wherein the at least one high erase verify level voltage includes a first double high erase verify level voltage and a second double high erase verify level voltage greater in magnitude than the first double high erase verify level voltage.

6. The memory apparatus as set forth in claim 5, wherein the control means is further configured to:
apply a second erase pulse of the plurality of erase pulses, the second erase pulse including an application of a second erase voltage greater than the first erase voltage to a fourth group of the plurality of bit lines coupled to a fourth group of the memory cells having the threshold voltage greater than the second double high erase verify level voltage in the second loop of the erase operation;
the second erase pulse further including the application of the second erase voltage minus a first double quick pass erase voltage to a fifth group of the plurality of bit lines coupled to a fifth group of the memory cells having the threshold voltage less than the second double high erase verify level voltage and greater than the first double high erase verify level voltage to slow erasing at a first rate in the second loop of the erase operation;
the second erase pulse further including the application of the second erase voltage minus a second double quick pass erase voltage to a sixth group of the plurality of bit lines coupled to a sixth group of the memory cells having the threshold voltage less than the first double high erase verify level voltage and greater than the target erase verify level voltage to slow erasing at a second rate higher than the first rate in the second loop of the erase operation; and
the second erase pulse further including the application of the second erase voltage minus an inhibit erase voltage to a third group of the plurality of bit lines coupled to a third group of the memory cells having the threshold voltage less than the target erase verify level voltage to completely inhibit erasing in the second loop of the erase operation.

7. The memory apparatus as set forth in claim 1, wherein the memory holes are grouped into a plurality of strings and the control means is further configured to completely inhibit erasing of ones of the memory cells disposed in unselected ones of the plurality of strings not being erased during the erase operation.

8. A controller in communication with a memory apparatus including memory cells configured to store a threshold voltage corresponding to one of a plurality of data states and disposed in memory holes each defining a channel, the channels being each connected to one of a plurality of bit lines, the controller configured to:
instruct the memory apparatus to apply a first erase pulse of a plurality of erase pulses, the first erase pulse including the application of a first erase voltage to the bit lines of each of the memory holes including memory cells being erased in a first loop of an erase operation;
instruct the memory apparatus to verify the threshold voltage of the memory cells being erased using a target erase verify level voltage and at least one high erase verify level voltage higher than the target erase verify level voltage; and instruct the memory apparatus to slow erasing of a first group of the memory cells being erased in a second loop of the erase operation in response to the threshold voltage of the first group of the memory cells being erased being greater than the target erase verify level voltage and less than the at least one high erase verify level voltage.

9. The controller as set forth in claim 8, wherein the controller is further configured to:

instruct the memory apparatus to not slow erasing a second group of the memory cells being erased in the second loop of the erase operation in response to the threshold voltage of a second group of the memory cells being erased being greater than the at least one high erase verify level voltage; and instruct the memory apparatus to completely inhibit erasing a third group of the memory cells being erased in the second loop of the erase operation in response to the threshold voltage of the third group of the memory cells being erased being less than the target erase verify level voltage.

10. The controller as set forth in claim 8, wherein the at least one high erase verify level voltage only includes a single high erase verify level voltage.

11. The controller as set forth in claim 10, wherein the controller is further configured to:

instruct the memory apparatus to apply a second erase pulse of the plurality of erase pulses, the second erase pulse including the application of a second erase voltage greater than the first erase voltage to a second group of the plurality of bit lines coupled to a second group of the memory cells having the threshold voltage greater than the single high erase verify level voltage in the second loop of the erase operation;

the second erase pulse also including the application of the second erase voltage minus a single quick pass erase voltage to a first group of the plurality of bit lines coupled to the first group of the memory cells having the threshold voltage less than the single high erase verify level voltage and greater than the target erase verify level voltage to slow erasing in the second loop of the erase operation; and the second erase pulse also including the application of the second erase voltage minus an inhibit erase voltage to a third group of the plurality of bit lines coupled to a third group of the memory cells having the threshold voltage less than the target erase verify level voltage to completely inhibit erasing in the second loop of the erase operation.

12. The controller as set forth in claim 8, wherein the at least one high erase verify level voltage includes a first double high erase verify level voltage and a second double high erase verify level voltage greater in magnitude than the first double high erase verify level voltage.

13. The controller as set forth in claim 12, wherein the controller is further configured to:

instruct the memory apparatus to apply a second erase pulse of the plurality of erase pulses, the second erase pulse including an application of a second erase voltage greater than the first erase voltage to a fourth group of the plurality of bit lines coupled to a fourth group of the memory cells having the threshold voltage greater than the second double high erase verify level voltage in the second loop of the erase operation;

the second erase pulse further including the application of the second erase voltage minus a first double quick pass erase voltage to a fifth group of the plurality of bit lines coupled to a fifth group of the memory cells having the threshold voltage less than the second double high erase verify level voltage and greater than the first double high erase verify level voltage to slow erasing at a first rate in the second loop of the erase operation;

the second erase pulse further including the application of the second erase voltage minus a second double quick pass erase voltage to a sixth group of the plurality of bit lines coupled to a sixth group of the memory cells having the threshold voltage less than the first double high erase verify level voltage and greater than the target erase verify level voltage to slow erasing at a second rate higher than the first rate in the second loop of the erase operation; and the second erase pulse further including the application of the second erase voltage minus an inhibit erase voltage to a third group of the plurality of bit lines coupled to a third group of the memory cells having the threshold voltage less than the target erase verify level voltage to completely inhibit erasing in the second loop of the erase operation.

14. A method of operating a memory apparatus including memory cells configured to store a threshold voltage corresponding to one of a plurality of data states and disposed in memory holes each defining a channel, the channels being each connected to one of a plurality of bit lines; the method comprising the steps of:

applying a first erase pulse of a plurality of erase pulses, the first erase pulse including an application of a first erase voltage to the bit line of each of the memory holes including the memory cells being erased in a first loop of an erase operation;

verifying the threshold voltage of the memory cells being erased using a target erase verify level voltage and at least one high erase verify level voltage higher than the target erase verify level voltage; and slowly erasing a first group of the memory cells being erased in a second loop of the erase operation in response to the threshold voltage of the first group of the memory cells being erased being greater than the target erase verify level voltage and less than the at least one high erase verify level voltage.

15. The method as set forth in claim 14, further including the steps of:

not slowly erasing a second group of the memory cells being erased in the second loop of the erase operation in response to the threshold voltage of a second group of the memory cells being erased being greater than the at least one high erase verify level voltage; and completely inhibiting erasing a third group of the memory cells being erased in the second loop of the erase operation in response to the threshold voltage of a third group of the memory cells being erased being less than the target erase verify level voltage.

16. The method as set forth in claim 14, wherein the at least one high erase verify level voltage only includes a single high erase verify level voltage.

17. The method as set forth in claim 16, wherein the method further includes the steps of:

applying a second erase pulse of the plurality of erase pulses, the second erase pulse including an application of a second erase voltage greater than the first erase voltage to a second group of the plurality of bit lines coupled to a second group of the memory cells having the threshold voltage greater than the single high erase verify level voltage in the second loop of the erase operation;

the second erase pulse further including an application of the second erase voltage minus a single quick pass erase voltage to a first group of the plurality of bit lines coupled to the first group of the memory cells having the threshold voltage less than the single high erase verify level voltage and greater than the target erase verify level voltage to slow erasing in the second loop of the erase operation; and the second erase pulse further including an application of the second erase voltage minus an inhibit erase voltage to a third group of the plurality of bit lines coupled to a third group of the memory cells having the threshold voltage less than the target erase verify level voltage to completely inhibit erasing in the second loop of the erase operation.

18. The method as set forth in claim 14, wherein the at least one high erase verify level voltage includes a first double high erase verify level voltage and a second double high erase verify level voltage greater in magnitude than the first double high erase verify level voltage.

19. The method as set forth in claim 18, wherein the method further includes the steps of:

applying a second erase pulse of the plurality of erase pulses, the second erase pulse including an application of a second erase voltage greater than the first erase voltage to a fourth group of the plurality of bit lines coupled to a fourth group of the memory cells having the threshold voltage greater than the second double high erase verify level voltage in the second loop of the erase operation;

the second erase pulse further including an application of the second erase voltage minus a first double quick pass erase voltage to a fifth group of the plurality of bit lines coupled to a fifth group of the memory cells having the threshold voltage less than the second double high erase verify level voltage and greater than the first double high erase verify level voltage to slow erasing at a first rate in the second loop of the erase operation;

the second erase pulse further including an application of the second erase voltage minus a second double quick pass erase voltage to a sixth group of the plurality of bit lines coupled to a sixth group of the memory cells having the threshold voltage less than the first double high erase verify level voltage and greater than the target erase verify level voltage to slow erasing at a second rate higher than the first rate in the second loop of the erase operation; and the second erase pulse further including an application of the second erase voltage minus an inhibit erase voltage to a third group of the plurality of bit lines coupled to a third group of the memory cells having the threshold voltage less than the target erase verify level voltage to completely inhibit erasing in the second loop of the erase operation.

20. The method as set forth in claim 14, wherein the memory holes are grouped into a plurality of strings and the method further includes the step of completely inhibiting erasing of ones of the memory cells disposed in unselected ones of the plurality of strings not being erased during the erase operation.

* * * * *